(12) United States Patent
Yu et al.

(10) Patent No.: US 12,155,111 B2
(45) Date of Patent: Nov. 26, 2024

(54) ELECTRONIC PACKAGE

(71) Applicant: Advanced Semiconductor Engineering, Inc., Kaohsiung (TW)

(72) Inventors: Chung Ju Yu, Kaohsiung (TW); Shao-Lun Yang, Kaohsiung (TW); Chun-Hung Yeh, Kaohsiung (TW); Hong Jie Chen, Kaohsiung (TW); Tsung-Wei Lu, Kaohsiung (TW); Wei Shuen Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 405 days.

(21) Appl. No.: 17/566,573

(22) Filed: Dec. 30, 2021

(65) Prior Publication Data

US 2023/0216174 A1 Jul. 6, 2023

(51) Int. Cl.
*H01L 23/66* (2006.01)
*H01L 21/56* (2006.01)
*H01L 23/06* (2006.01)
*H01L 23/31* (2006.01)
*H01Q 1/22* (2006.01)
*H01Q 13/18* (2006.01)

(52) U.S. Cl.
CPC ......... *H01Q 1/2283* (2013.01); *H01L 21/561* (2013.01); *H01L 23/06* (2013.01); *H01L 23/3128* (2013.01); *H01L 2223/6677* (2013.01); *H01Q 13/18* (2013.01)

(58) Field of Classification Search
None
See application file for complete search history.

(56) References Cited

U.S. PATENT DOCUMENTS

| | | | |
|---|---|---|---|
| 8,718,550 B2 | 5/2014 | Zhao et al. | |
| 2020/0105687 A1* | 4/2020 | Wang | H01Q 21/0093 |
| 2020/0273823 A1 | 8/2020 | Chen et al. | |
| 2020/0328144 A1* | 10/2020 | Fan | H01L 21/56 |
| 2020/0388928 A1* | 12/2020 | Lin | H01L 23/3128 |
| 2023/0132846 A1* | 5/2023 | Pan | H01Q 1/40 |
| | | | 343/834 |

* cited by examiner

*Primary Examiner* — Jay C Chang
(74) *Attorney, Agent, or Firm* — FOLEY & LARDNER LLP

(57) ABSTRACT

An electronic package and a method of manufacturing an electronic package are provided. The electronic package includes a carrier, an antenna substrate, and an electronic component. The carrier has a first surface and a second surface. The antenna substrate includes a resonant cavity and is disposed over the first surface. The antenna substrate is closer to the first surface than the second surface of the carrier. The electronic component is disposed between the antenna substrate and the second surface of the carrier.

7 Claims, 26 Drawing Sheets

ELECTRONIC PACKAGE

BACKGROUND

1. Technical Field

The present disclosure relates generally to an electronic package and a method of manufacturing an electronic package.

2. Description of the Related Art

Currently, while in structures including antennas in packages (AiP) or antennas in modules (AiM), resonant cavities configured to increase RF signals may be formed by multiple dielectric layers, this approach can negatively impact manufacturing yield. As a possible solution, the resonant cavities may be formed by stacking an antenna substrate with an RF substrate. However, encapsulant or molding material can flash over the antenna substrate, adversely affecting performance thereof.

SUMMARY

In some embodiments, an electronic package includes a carrier, an antenna substrate, and an electronic component. The carrier has a first surface and a second surface. The antenna substrate includes a resonant cavity and is disposed over the first surface. The antenna substrate is closer to the first surface than the second surface of the carrier. The electronic component is disposed between the antenna substrate and the second surface of the carrier.

In some embodiments, an electronic package includes a carrier, an antenna substrate, and a protective element. The antenna substrate is over the carrier and configured to electrically connect to the carrier. The protective element supports the antenna substrate. A portion of the carrier is embedded within the protective element.

In some embodiments, an electronic package includes a carrier, an antenna substrate, and a protective element. The carrier includes a first surface and a lateral surface angled with the first surface. The antenna substrate is disposed over the first surface of the carrier. The protective element is disposed between the first surface of the carrier and the antenna substrate and encapsulates the lateral surface of the carrier.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
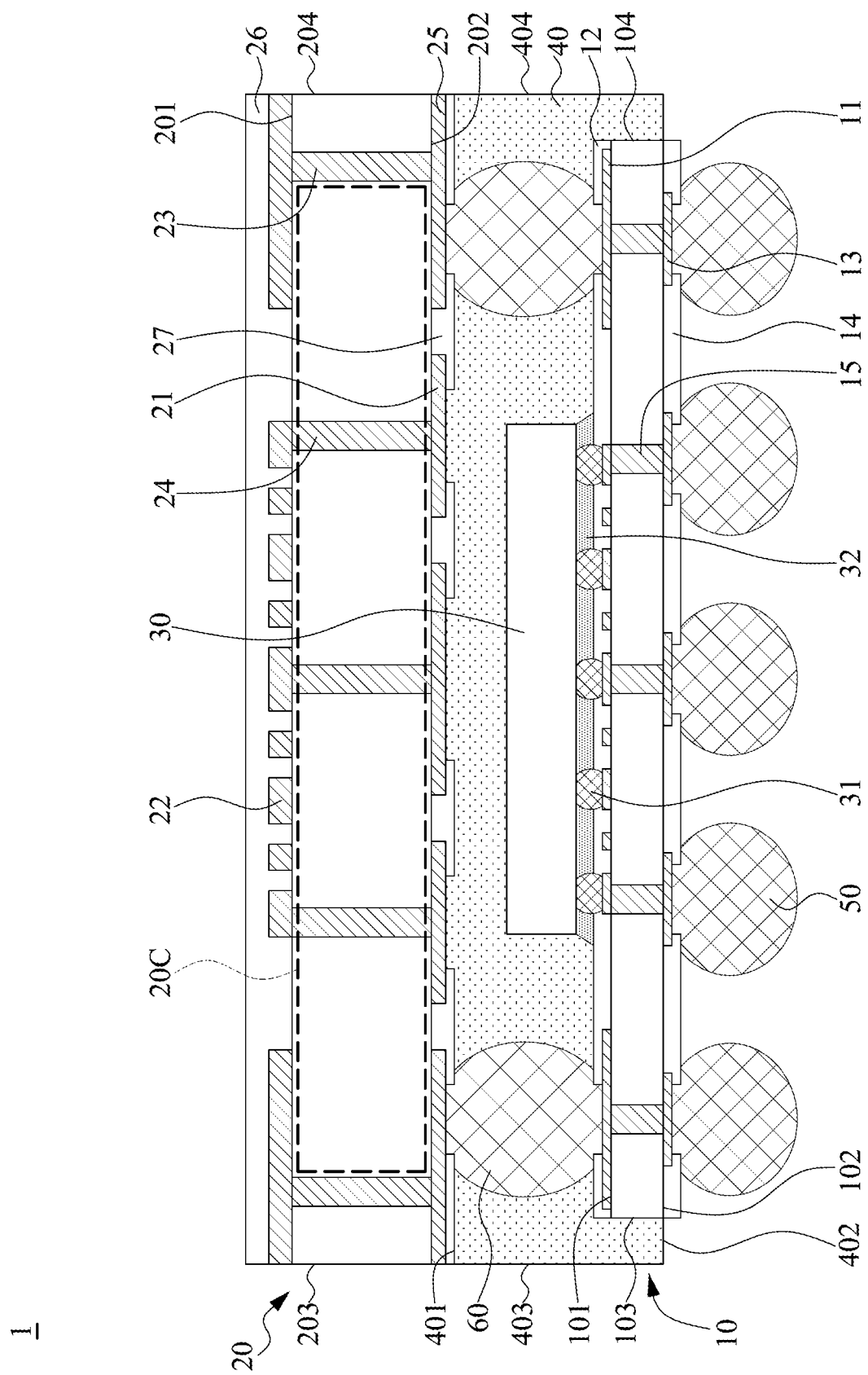
FIG. 1A is a cross-section of an electronic package in accordance with some embodiments of the present disclosure.

FIG. 1A is a cross-section of an electronic package 1 in accordance with some embodiments of the present disclosure. The electronic package 1 includes a carrier 10, an antenna substrate 20, an electronic component 30, a protective element 40, electrical contacts 50, and supporters 60.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces and/or a plurality of conductive through vias. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The carrier 10 has a surface 101 (also referred to as "a top surface"), a surface 102 (also referred to as "a bottom surface") opposite to the surface 101, and surfaces 103 and 104 (also referred to as "side surfaces" or "lateral surfaces") extending between the surface 101 and the surface 102. The surface 103 may be opposite to the surface 104. The surfaces 103 and 104 may be angled with or non-parallel to the surface 101. In some embodiments, the carrier 10 includes one or more conductive pads 11 in proximity to, adjacent to, or embedded in and exposed by the surface 101 of the carrier 10. In some embodiments, the carrier 10 includes a solder resist 12 on the surface 101 of the carrier 10 fully or partially exposing at least a portion of the conductive pads 11 for electrical connections. In some embodiments, the top surface of the solder resist 12 may be referred to as a top surface of the carrier 10. In some embodiments, the carrier 10 includes one or more conductive pads 13 in proximity to, adjacent to, or embedded in and exposed by the surface 102 of the carrier 10. In some embodiments, the carrier 10 includes a solder resist 14 on the surface 102 of the carrier 10 fully or partially exposing at least a portion of the conductive pads 13 for electrical connections. In some embodiments, the bottom surface of the solder resist 14 may be referred to as a bottom surface of the carrier 10. In some embodiments, the carrier 10 includes one or more conductive elements 15 electrically connecting the conductive pads 11 and the conductive pads 13. The conductive elements 15 may be or include conductive through vias passing a core layer of the carrier 10. In some embodiments, a lateral surface of the solder resist 12, the surface 103, and a lateral surface of the solder resist 14 may be collectively referred to as a lateral surface or side surface of the carrier 10. In some embodiments, a lateral surface of the solder resist 12, the surface 104, and a lateral surface of the solder resist 14 may be collectively referred to as a lateral surface or side surface of the carrier 10.

The antenna substrate 20 may be disposed over the surface 101 of the carrier 10. In some embodiments, the antenna substrate 20 is closer to the surface 101 than the surface 102 of the carrier 10. In some embodiments, the antenna substrate 20 includes a resonant cavity 20C. In some embodiments, the antenna substrate 20 is configured to electrically connect to the carrier 10. The antenna substrate 20 has a surface 201, a surface 202 opposite to the surface 201, and surfaces 203 and 204 (also referred to as "side surfaces" or "lateral surfaces") extending between the surface 201 and the surface 202. In some embodiments, the surface 103 of the carrier 10 is recessed from the surface 203 of the antenna substrate 20. In some embodiments, the surface 104 of the carrier 10 is recessed from the surface 204 of the antenna substrate 20. In some embodiments, the antenna substrate 20 may have a thickness from about 800 µm to about 1000 µm. In some embodiments, the thickness of the antenna substrate 20 may be greater than a thickness of the carrier 10.

In some embodiments, the antenna substrate 20 includes a ground element 21, an antenna pattern 22, a feeding element 23, a grounding element 24, a feed element 25, a protective element 26, and a solder resist 27. In some embodiments, the antenna pattern 22 is disposed over the ground element 21, and the resonant cavity 20C is defined by the ground element 21 and the antenna pattern 22. In some embodiments, the ground element 21 physically separates the resonant cavity 20C apart from the electronic component 30. In some embodiments, the feeding element 23 electrically connects the carrier 10 to the antenna substrate 20. In some embodiments, the feeding element 23 electrically connects the carrier 10 to the antenna pattern 22. In some embodiments, the feeding element 23 is physically separated from the ground element 21. In some embodiments, the feeding element 23 electrically connects the antenna pattern 22 to the feed element 25. In some embodiments, the grounding element 24 electrically connects the antenna pattern 22 to the ground element 21. The feeding element 23 and the grounding element 24 may be or include conductive through vias. In some embodiments, the protective element 26 covers the antenna pattern 22. The protective element 26 may be or include an anti-oxidation layer, such as a solder resist (or a solder mask). In some embodiments, the solder resist 27 is on the surface 202 of the antenna substrate 20 for fully or partially exposing at least a portion of the ground element 21 and a portion of the feed element 25 for electrical connections.

The electronic component 30 may be disposed between the antenna substrate 20 and the carrier 10. In some embodiments, the electronic component 30 is electrically connected to the carrier 10. The electronic component 30 may be bonded to the carrier 10 by way of flip-chip technique. For example, the electronic component 30 may be electrically connected to the conductive pads 11 through conductive bumps 31 which are covered by an underfill 32. The electronic component 30 may be a chip or a die including a semiconductor substrate, one or more integrated circuit devices, and one or more overlying interconnection structures. The integrated circuit devices may include active devices such as transistors and/or passive devices such as resistors, capacitors, inductors, or a combination thereof. For example, the electronic component 30 may include an RF circuit, a digital circuit, and/or a mixed-signal circuit. In some embodiments, the number or the type of the electronic component 30 can be changed depending on design specifications.

The protective element 40 may support the antenna substrate 20. In some embodiments, the protective element 40 is disposed between the surface 101 of the carrier 10 and the antenna substrate 20. In some embodiments, a portion of the carrier 10 is embedded within the protective element 40. In some embodiments, the protective element 40 covers or encapsulates the electronic component 30. The protective element 40 has a surface 401, a surface 402 (also referred to as "a bottom surface") opposite to the surface 401, and surfaces 403 and 404 (also referred to as "side surfaces" or "lateral surfaces") extending between the surface 401 and the surface 402. In some embodiments, the surface 103 (or the side surface) of the carrier 10 is distant from the surface 403 (or the side surface) of the protective element 40. For example, the protective element 40 may cover or encapsulate the surface 103 of the carrier 10. For example, the protective element 40 may cover or encapsulate a lateral surface of the solder resist 14 and the surface 103 of the carrier 10. In some embodiments, the surface 104 (or the side surface) of the carrier 10 is distant from the surface 404 (or the side surface) of the protective element 40. For example, the protective element 40 may cover or encapsulate the surface 104 of the carrier 10. For example, the protective element 40 may cover or encapsulate a lateral surface of the solder resist 14 and the surface 104 of the carrier 10. In some embodiments, the surface 102 (or the bottom surface) of the carrier 10 is substantially coplanar with the surface 402 (or the bottom surface) of the protective element 40. In some embodiments, the protective element 40 may be or include an encapsulant. The encapsulant may include an epoxy resin having fillers, a molding compound (e.g., an epoxy molding compound or other molding compound), polyimide, a phenolic compound or material, a material with silicone dispersed therein, or a combination thereof.

The electrical contacts 50 may be disposed on the surface 102 of the carrier 10. In some embodiments, the electrical contacts 50 may include conductive bumps or solder balls situated on corresponding conductive pads 13 in proximity to, adjacent to, or embedded in and exposed by the surface 102 of the carrier 10. In some embodiments, the electrical contacts 50 may be or include gold (Au), silver (Ag), copper (Cu), another metal, a solder alloy, or a combination of two or more thereof. In some embodiments, the electrical contacts 50 may include a controlled collapse chip connection (C4) bump, a ball grid array (BGA) or a land grid array (LGA).

The supporters 60 may be disposed between the antenna substrate 20 and the carrier 10. In some embodiments, the supporters 60 contact the solder resist 27 of the antenna substrate 20 and the solder resist 12 of the carrier 10. In some embodiments, the supporters 60 may be configured to define a distance or a space between the antenna substrate 20 and the carrier 10. In some embodiments, the supporters 60 are disposed on the conductive pads 11 of the carrier 10. In some embodiments, the supporters 60 may include a conductive material. In some embodiments, the supporter 60 is configured to electrically connect the antenna substrate 20 to the carrier 10. In some embodiments, the supporter 60 is electrically connected to the feeding element 23 of the antenna substrate 20. In some embodiments, the supporters 60 may include conductive bumps or solder balls. In some embodiments, the supporters 60 may be or may include Au, Ag, Cu, another metal, a solder alloy, or a combination of two or more thereof.

According to some embodiments of the present disclosure, a portion of the protective element 40 extending onto the surfaces 103 and 104 of the carrier 10 may serve as a "mold lock" that interlocks the carrier 10 and the antenna substrate 20, and thus the bonding strength between the protective element 40 and the carrier 10 can be increased. Therefore, delamination can be mitigated or prevented, and the structural stability and the reliability of the electronic package 1 can be improved.

Figure 1B:
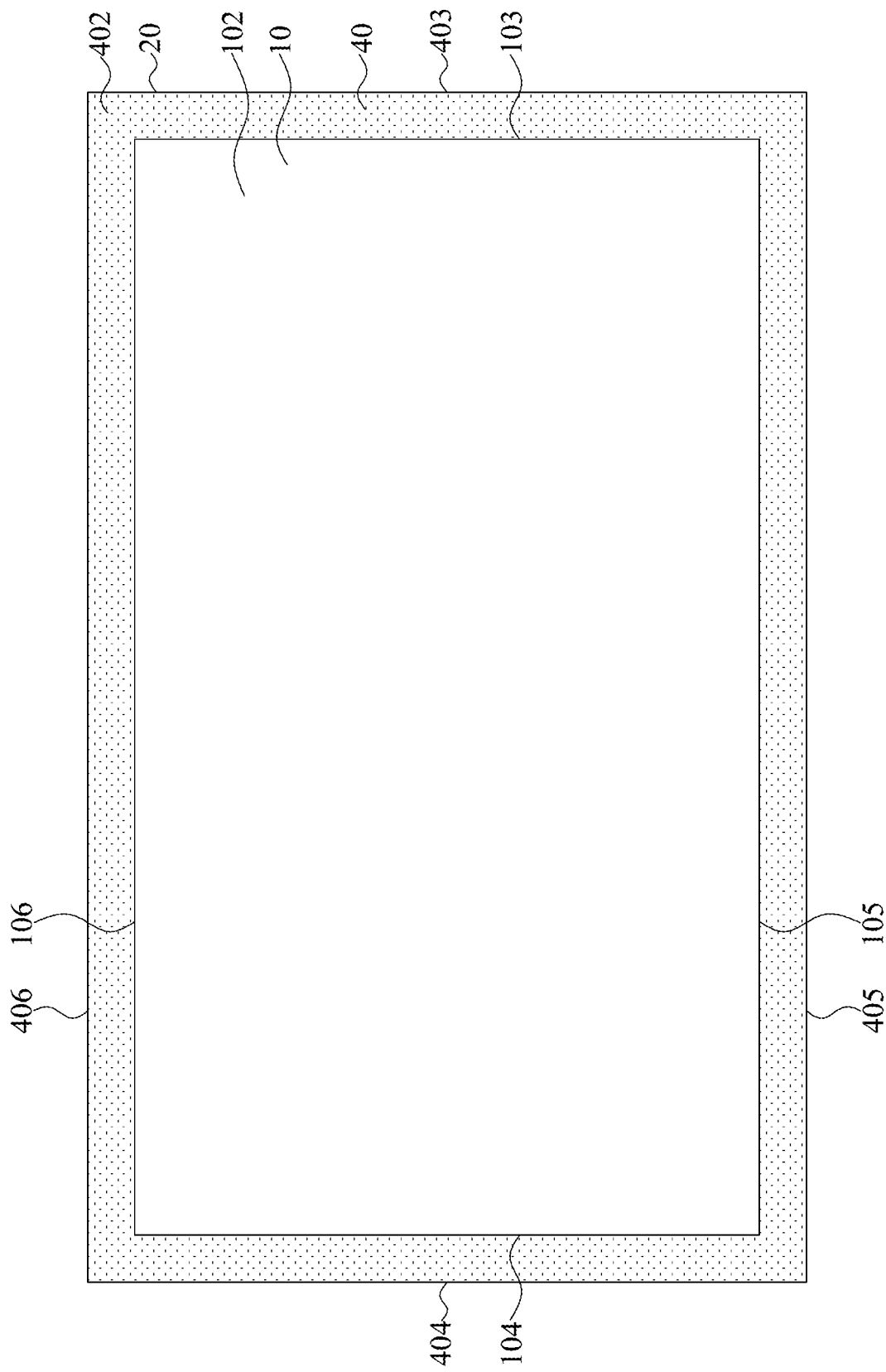
FIG. 1B is an underside view of an electronic package in accordance with some embodiments of the present disclosure.

FIG. 1B is an underside view of an electronic package 1 in accordance with some embodiments of the present disclosure. In some embodiments, FIG. 1B shows an underside view of the electronic package 1 illustrated in FIG. 1A. It should be noted that some elements (e.g., the solder resist 14 and the electrical contacts 50) are omitted from FIG. 1B for clarity.

The carrier 10 further includes surfaces 105 and 106 (also referred to as "side surfaces" or "lateral surfaces"). The surface 105 may be opposite to the surface 106. The surfaces 105 and 106 may be angled with or non-parallel to the surface 103. The protective element 40 further includes surfaces 405 and 406 (also referred to as "side surfaces" or "lateral surfaces"). The surface 405 may be opposite to the surface 406. The surfaces 405 and 406 may be angled with or non-parallel to the surface 403. In some embodiments, the surface 105 (or the side surface) of the carrier 10 is distant from the surface 405 (or the side surface) of the protective element 40. For example, the protective element 40 may cover the surface 105 of the carrier 10. In some embodiments, the surface 106 (or the side surface) of the carrier 10 is distant from the surface 406 (or the side surface) of the protective element 40. For example, the protective element 40 may cover the surface 106 of the carrier 10.

In some embodiments, referring to FIG. 1A, a projection of the carrier 10 on the antenna substrate 20 completely overlaps a projection of the protective element 40 on the antenna substrate 20. In some embodiments, a projection of the carrier 10 on the protective element 40 is completely within the surface 402 of the protective element 40. In some embodiments, a portion of the protective element 40 covers the surfaces 103, 104, 105, and 106 of the carrier 10. In some embodiments, a portion of the protective element 40 physically or directly contacts the surfaces 103, 104, 105, and 106 of the carrier 10.

Figure 2:
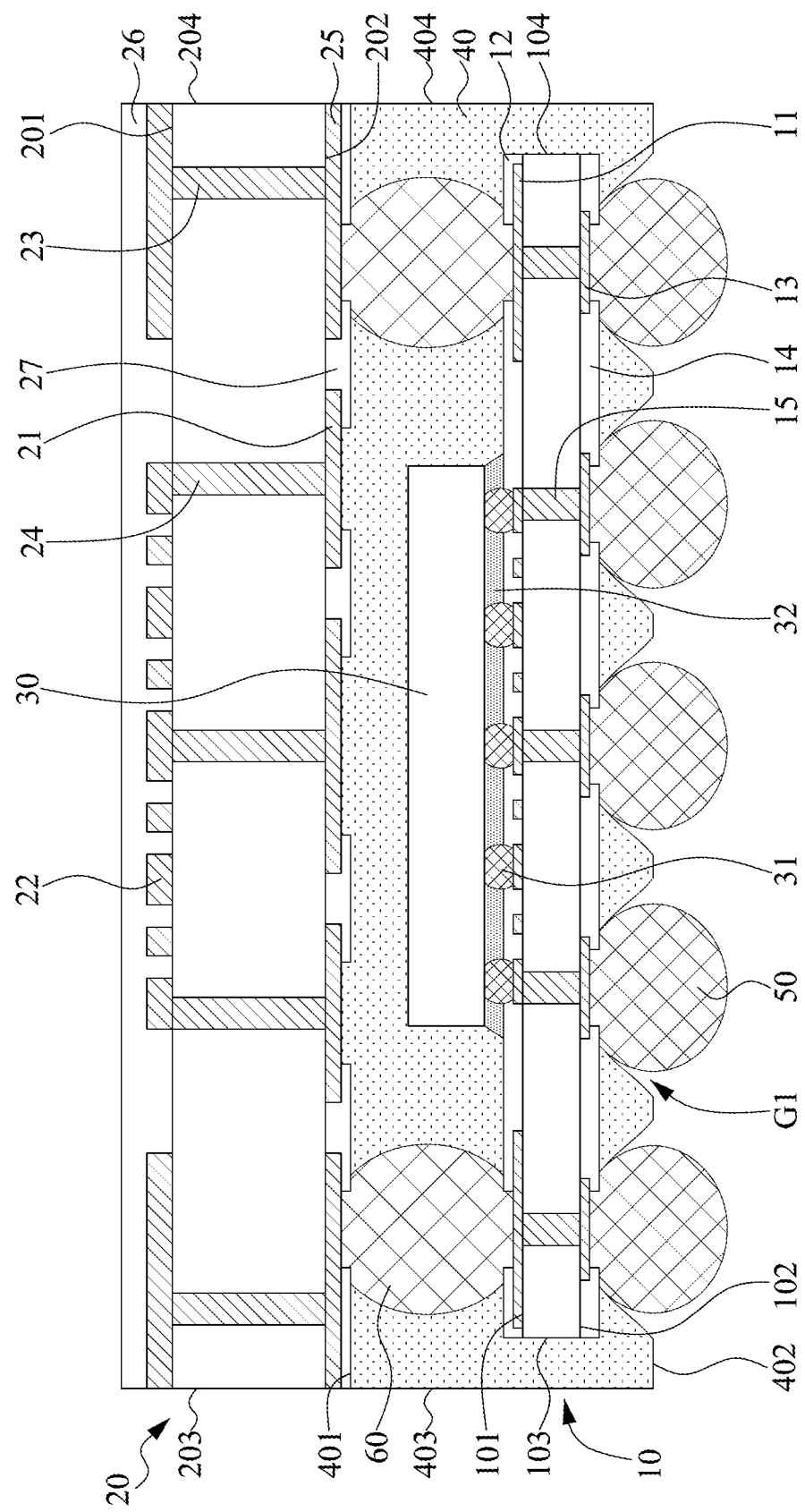
FIG. 2 is a cross-section of an electronic package in accordance with some embodiments of the present disclosure.

FIG. 2 is a cross-section of an electronic package 2 in accordance with some embodiments of the present disclosure. The electronic package 2 is similar to the electronic module 1 of FIG. 1A, differing therefrom as follows. Descriptions of similar components are omitted.

In some embodiments, the surface 102 (or the bottom surface) of the carrier 10 is distant from the surface 402 (or the bottom surface) of the protective element 40. For example, the protective element 40 may further cover at least a portion of the surface 102 of the carrier 10. For example, the protective element 40 may further cover at least a portion of the bottom surface of the solder resist 14 of the carrier 10. In some embodiments, the protective element 40 partially covers the surface 102 of the carrier 10. For example, the protective element 40 may cover a portion of the surface 102 on which the solder resist 14 is formed, and the protective element 40 may expose a portion of the surface 102 on which the conductive pads 13 are formed. In some embodiments, the protective element 40 partially covers the bottom surface of the solder resist 14 of the carrier 10. For example, the protective element 40 may cover a portion of bottom surface of the solder resist 14, and the protective element 40 may expose a portion of the bottom surface of the solder resist 14 on which the conductive pads 13 are formed. In some embodiments, the protective element 40 may fully cover or encapsulate the lateral surface (or the side surface) of the carrier 10. For example, the protective element 40 may fully cover or encapsulate the surface 103 of the carrier 10. For example, the protective element 40 may fully cover or encapsulate a lateral surface of the solder resist 14, and the surface 103, and a lateral surface of the solder resist 12. For example, the protective element 40 may fully cover or encapsulate the surface 104 of the carrier 10. For example, the protective element 40 may fully cover or encapsulate a lateral surface of the solder resist 14, and the surface 104, and a lateral surface of the solder resist 12.

In some embodiments, the electrical contacts 50 are encapsulated by the protective element 40. In some embodiments, the electrical contact 50 is disposed on the portion of the surface 102 of the carrier 10 on which the conductive pad 13 is formed, and a portion of the electrical contact 50 is covered by the protective element 40. In some embodiments, a bottom portion of the electrical contact 50 contacts the protective element 40. In some embodiments, a top portion (e.g., side surfaces or lateral surfaces of the top portion) of the electrical contact 50 is spaced apart from the protective element 40 by a gap G1.

In some cases where a material or element different from the protective element 40 may be disposed on the surface 102 of the carrier 10, the difference between the coefficient of thermal expansion (CTE) of the different material or element and the CTE of the protective element 40 may raise a CTE mismatch issue. According to some embodiments of the present disclosure, the protective element 40 including a portion on the surface 102 of the carrier 10, and another portion between the carrier 10 and the antenna substrate 20, and thus the CTE mismatch between different materials or elements among the entire structure can be mitigated or prevented. Therefore, the stability and the reliability of the electronic package 2 can be improved.

Figure 3:
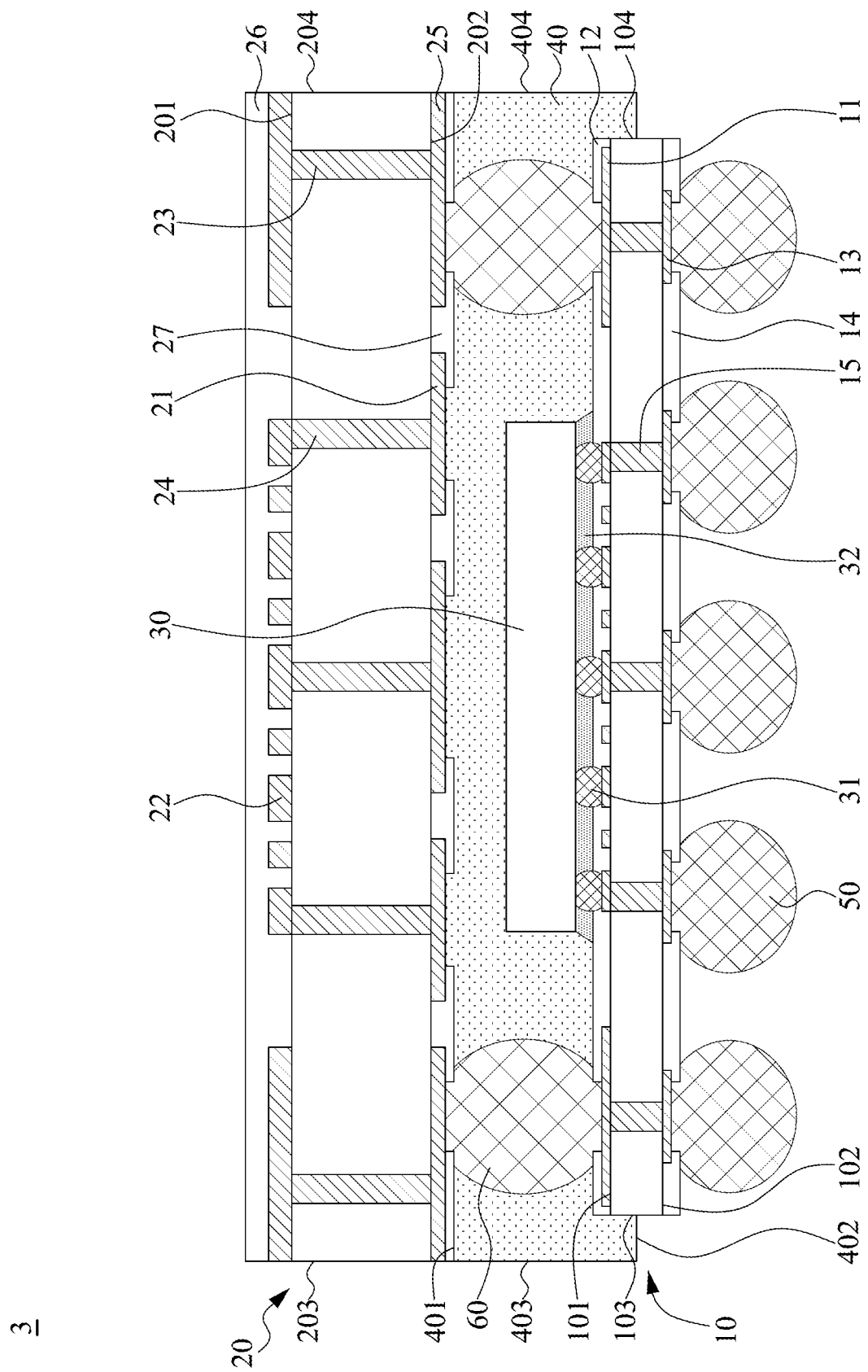
FIG. 3 is a cross-section of an electronic package in accordance with some embodiments of the present disclosure.

FIG. 3 is a cross-section of an electronic package 3 in accordance with some embodiments of the present disclosure. The electronic package 3 is similar to the electronic module 1 in FIG. 1A, differing therefrom as follows. Descriptions of similar components are omitted.

In some embodiments, the surface 102 (or the bottom surface) of the carrier 10 is distant from the surface 402 (or the bottom surface) of the protective element 40. In some embodiments, the protective element 40 partially covers the surface 103 of the carrier 10. In some embodiments, a portion of the surface 103 of the carrier 10 is exposed by the protective element 40. In some embodiments, the protective element 40 partially covers the surface 104 of the carrier 10. In some embodiments, a portion of the surface 104 of the carrier 10 is exposed by the protective element 40.

Figure 4:
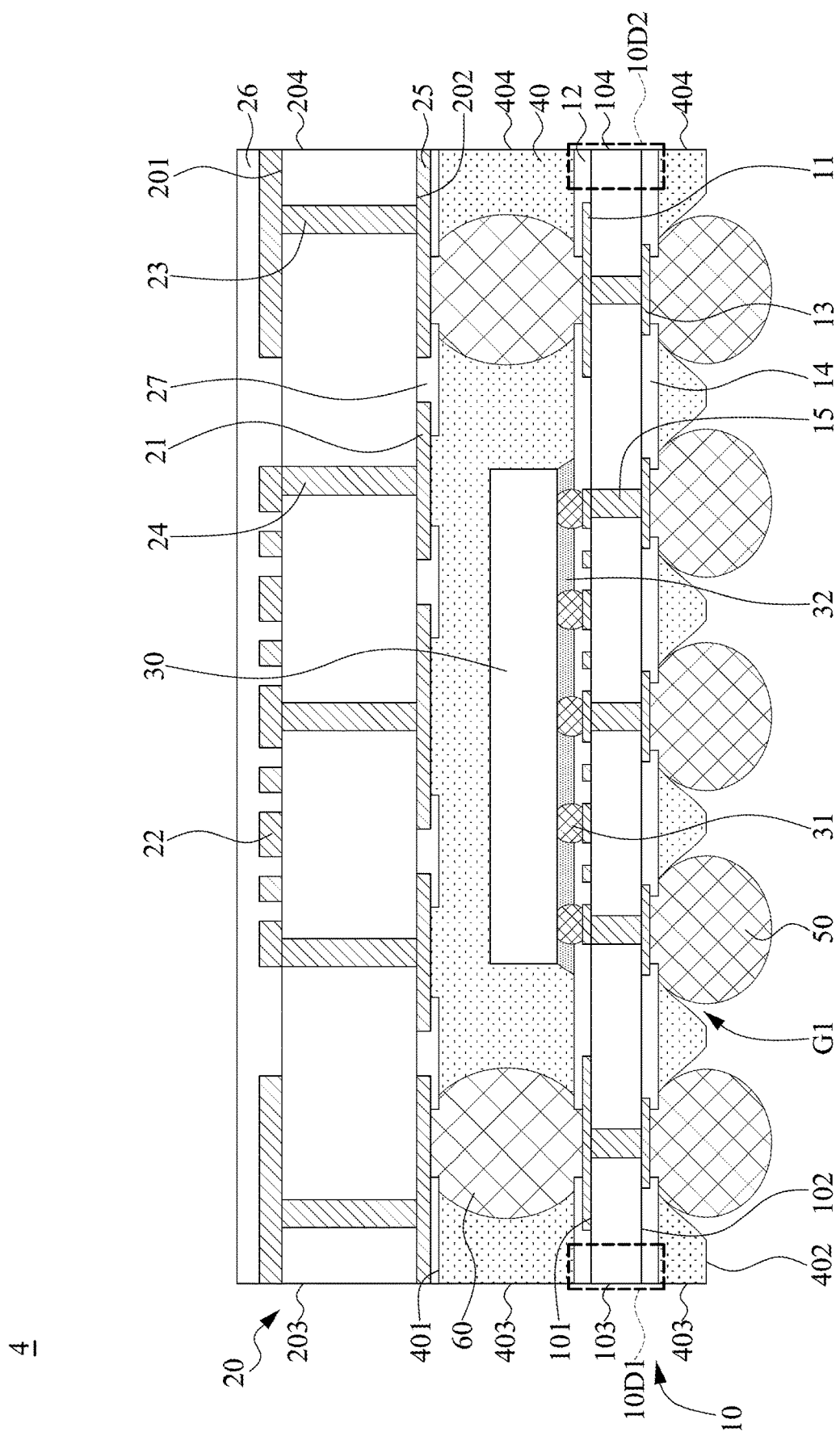
FIG. 4 is a cross-section of an electronic package in accordance with some embodiments of the present disclosure.

FIG. 4 is a cross-section of an electronic package 4 in accordance with some embodiments of the present disclosure. The electronic package 4 is similar to the electronic module 1 in FIG. 1A, differing therefrom as follows. Descriptions of similar components are omitted.

In some embodiments, the surface 103 of the carrier 10 is substantially aligned with the surface 203 of the antenna substrate 20. In some embodiments, the surface 103 of the carrier 10 is substantially aligned with the surface 403 of the protective element 40. In some embodiments, the surface 104 of the carrier 10 is substantially aligned with the surface 204 of the antenna substrate 20. In some embodiments, the surface 104 of the carrier 10 is substantially aligned with the surface 404 of the protective element 40.

In some embodiments, the carrier 10 includes one or more dummy regions (e.g., dummy regions 10D1 and 10D2). In some embodiments, the dummy region 10D1 is adjacent to the surface 103, and the dummy region 10D2 is adjacent to the surface 104. In some embodiments, the dummy region 10D1 is exposed by the surface 103, and the dummy region 10D2 is exposed by the surface 104. The dummy regions 10D1 and 10D2 may be regions of the carrier 10 without an interconnection structure. The dummy regions 10D1 and 10D2 may be regions of the carrier 10 having dummy conductive structures. In some embodiments, the dummy regions 10D1 and 10D2 are not electrically connected to the antenna substrate 20 and the electronic component 30.

Figure 5:
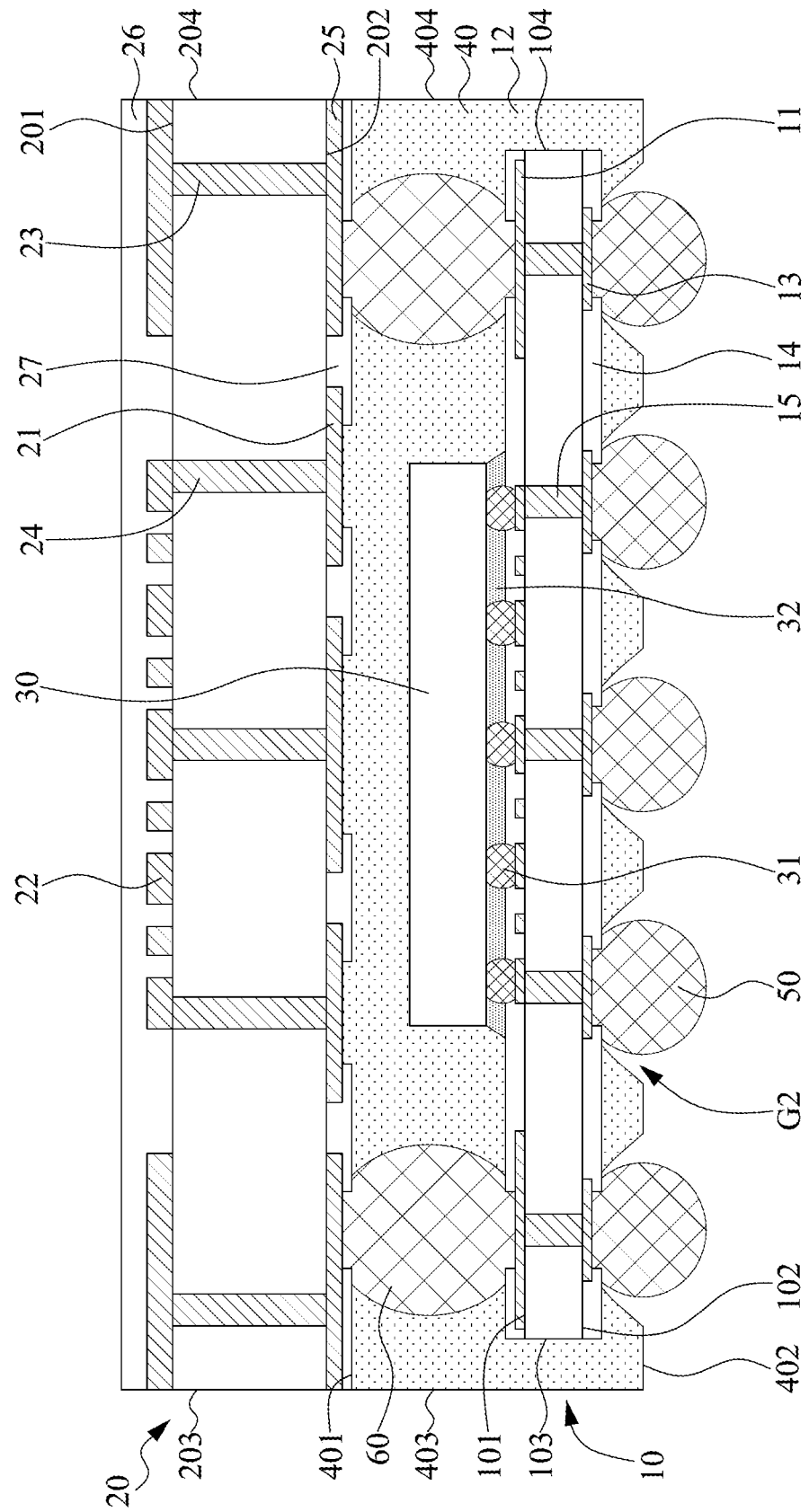
FIG. 5 is a cross-section of an electronic package in accordance with some embodiments of the present disclosure.

FIG. 5 is a cross-section of an electronic package 5 in accordance with some embodiments of the present disclosure. The electronic package 5 is similar to the electronic module 1 in FIG. 1A, differing therefrom as follows. Descriptions of similar components are omitted.

In some embodiments, the surface 102 (or the bottom surface) of the carrier 10 is distant from the surface 402 (or the bottom surface) of the protective element 40. For example, the protective element 40 may further cover at least a portion of the surface 102 of the carrier 10. In some embodiments, the protective element 40 partially covers the solder resist 14 of the carrier 10.

In some embodiments, the electrical contact 50 is disposed on the conductive pad 13 and a portion of the solder resist 14. In some embodiments, the electrical contact 50 is spaced apart from the protective element 40. In some embodiments, the electrical contact 50 (e.g., side surfaces or lateral surfaces of the electrical contact 50) is spaced apart from the protective element 40 by a gap G2. In some embodiments, a portion of the solder resist 14 is exposed to the gap G2.

FIG. 6A, FIG. 6B, FIG. 6C, FIG. 6D, FIG. 6E, FIG. 6F, FIG. 6G, and FIG. 6H illustrate various stages of a method of manufacturing an electronic package 2 in accordance with some embodiments of the present disclosure.

Figure 6A:
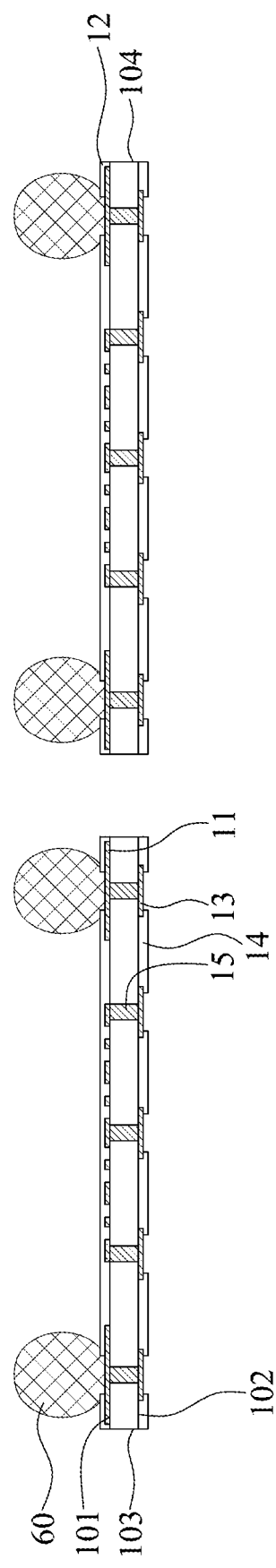
FIG. 6A, FIG. 6B, FIG. 6C, FIG. 6D, FIG. 6E, FIG. 6F, FIG. 6G, and FIG. 6H illustrate various stages of a method of manufacturing an electronic package in accordance with some embodiments of the present disclosure.

Referring to FIG. 6A, a plurality of carriers 10 may be provided, and a plurality of supporters 60 may be disposed on the carriers 10. Each of the carriers 10 has a surface 101 and a surface 102 opposite to the surface 101. In some embodiments, the supporters 60 may include conductive bumps or solder balls. In some embodiments, the supporters 60 are disposed on the surfaces 101 of the carriers 10. In some embodiments, the supporters 60 are disposed on the conductive pads 11 of the carriers 10.

Figure 6B:
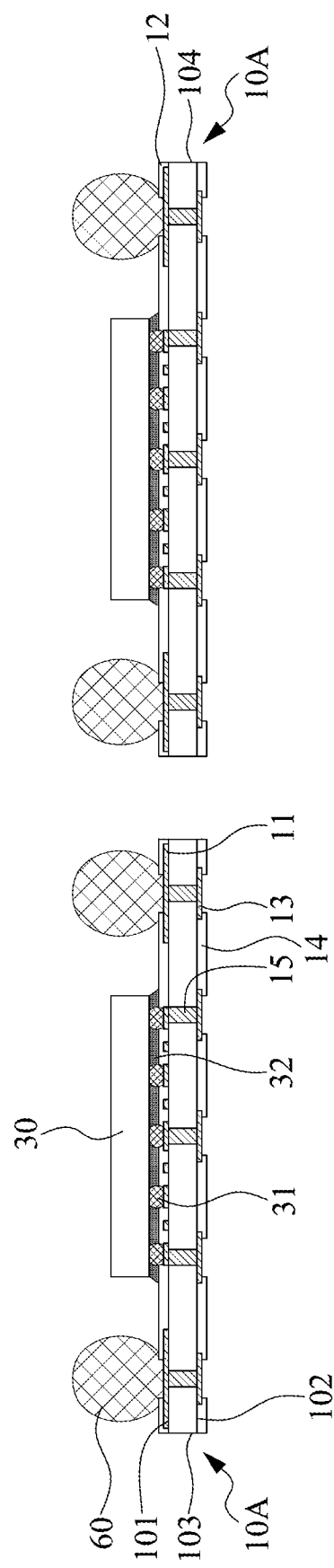

Referring to FIG. 6B, a plurality of electronic components 30 may be disposed on the surfaces 101 of the carriers 10 to form a plurality of device units 10A. The electronic components 30 may be bonded to the carriers 10 by way of flip-chip technique. In some embodiments, each of the carriers 10 has surfaces 103 and 104 (or side surfaces or lateral surfaces) angled with the surface 101.

Figure 6C:
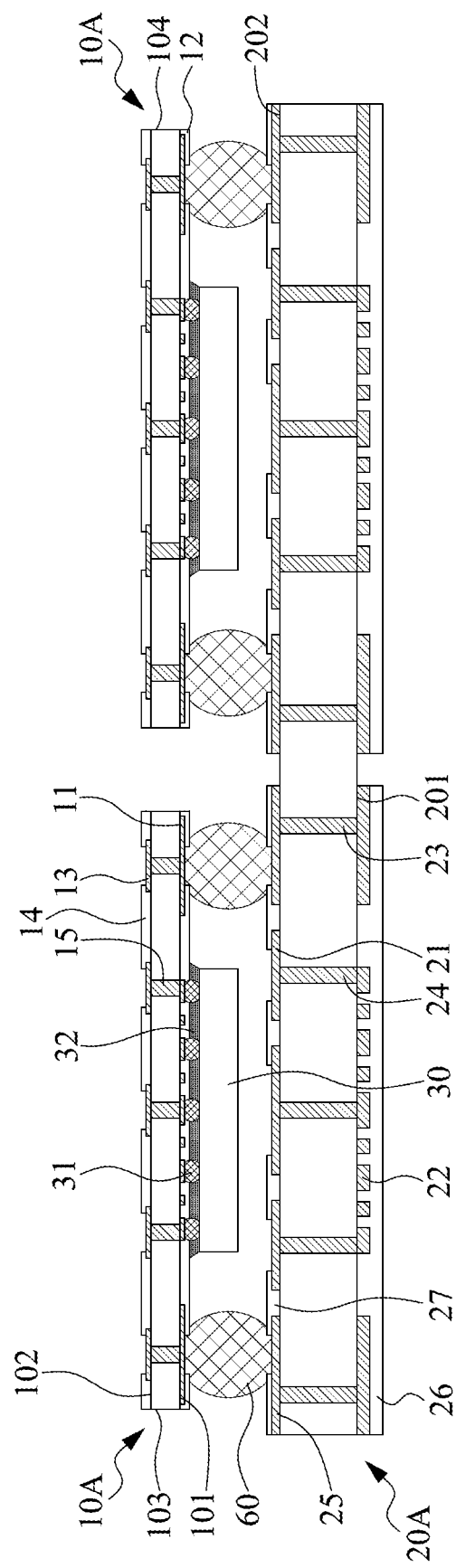

Referring to FIG. 6C, a substrate strip 20A may be provided, and the device units 10A may be disposed on the substrate strip 20A. In some embodiments, the substrate strip 20A includes a plurality of antenna patterns 22. In some embodiments, the device units 10A are bonded to the substrate strip 20A through the supporters 60.

Figure 6D:
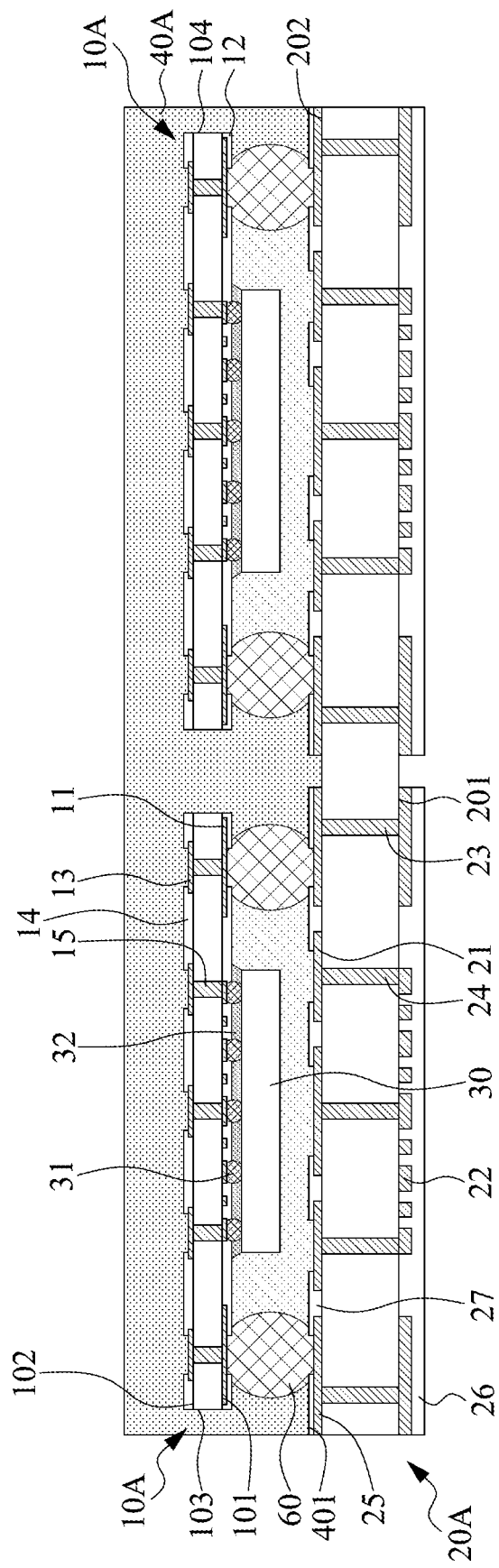

Referring to FIG. 6D, a protective material 40A may be disposed on the substrate strip 20A and between the device units 10A. In some embodiments, the protective material 40A covers the surfaces 103 and 104 of the carriers 10. In some embodiments, the protective material 40A further covers the surfaces 102 of the carriers 10. In some embodiments, the protective material 40A may be or includes an encapsulant material. The encapsulant material may include an epoxy resin having fillers, a molding compound (e.g., an epoxy molding compound or other molding compound), polyimide, a phenolic compound or material, a material with silicone dispersed therein, or a combination thereof. In some embodiments, the operation of disposing the protective material 40A (or the encapsulant material) may be referred to as an "over-molding operation," and the substrate strip 20A serves as a lower mold for the over-molding operation.

Figure 6E:
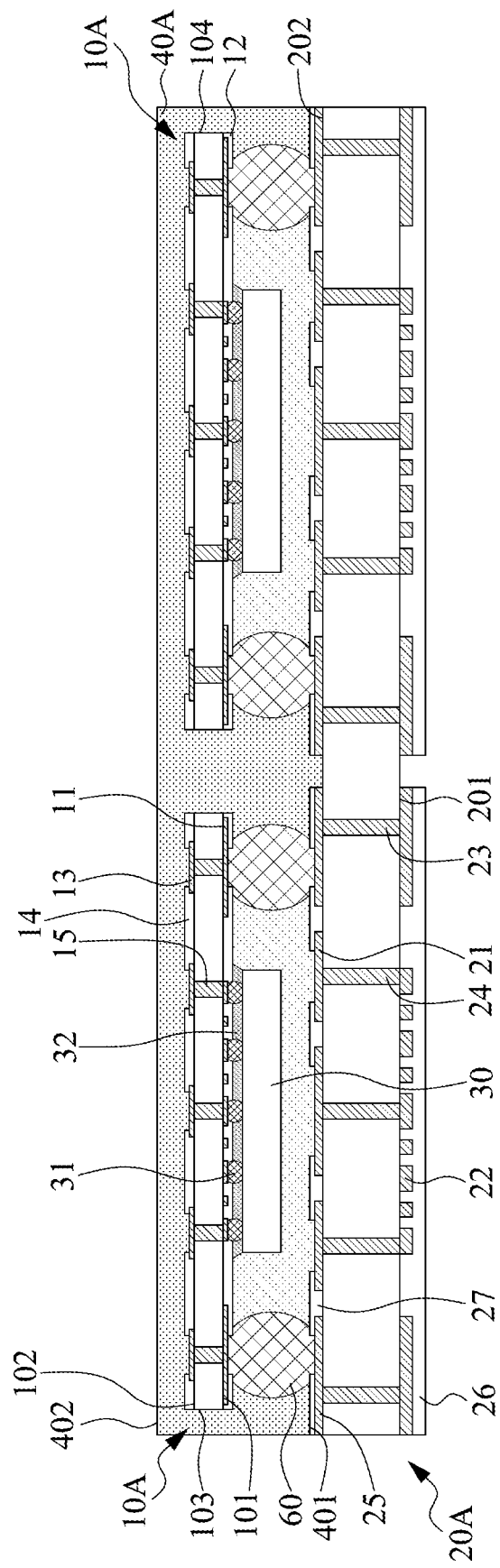

Referring to FIG. 6E, the protective material 40A may be thinned. In some embodiments, grinding may be performed on the protective material 40A to thin the protective material 40A. 40A. A portion of the protective material 40A over the surfaces 102 of the carriers 10 may have a reduced thickness after the thinning operation.

Figure 6F:
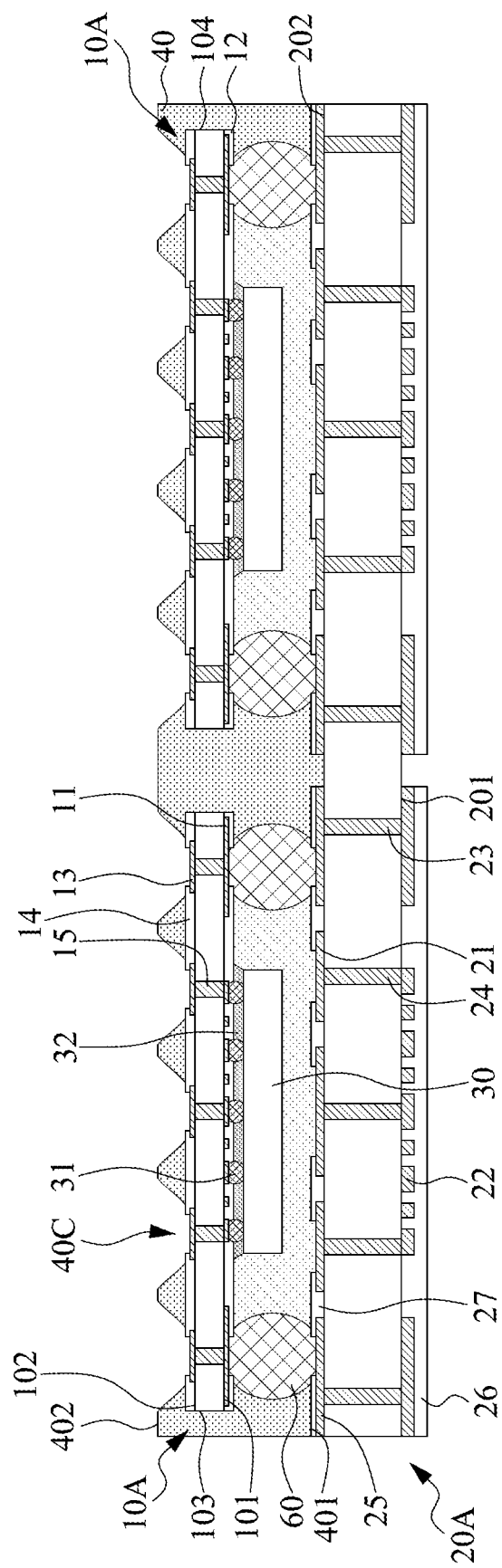

Referring to FIG. 6F, portions of the protective material 40A on the surfaces 102 of the carriers 10 may be removed to form a protective element 40 that exposes portions of the surfaces 102. In some embodiments, portions of the protective material 40A on the surfaces of the solder resist 14 of the carriers 10 may be removed to form a protective element 40 that exposes portions of the surfaces of the solder resist 14. The portions of the protective material 40A may be removed by laser ablation. In some embodiments, a plurality of cavities 40C are formed to expose portions of the surfaces 102 of the carriers 10. In some embodiments, the conductive pads 13 on the exposed portions of the surfaces 102 are exposed by the cavities 40C of the protective element 40. In some embodiments, portions of the solder resist 14 are exposed by the cavities 40C of the protective element 40.

Figure 6G:
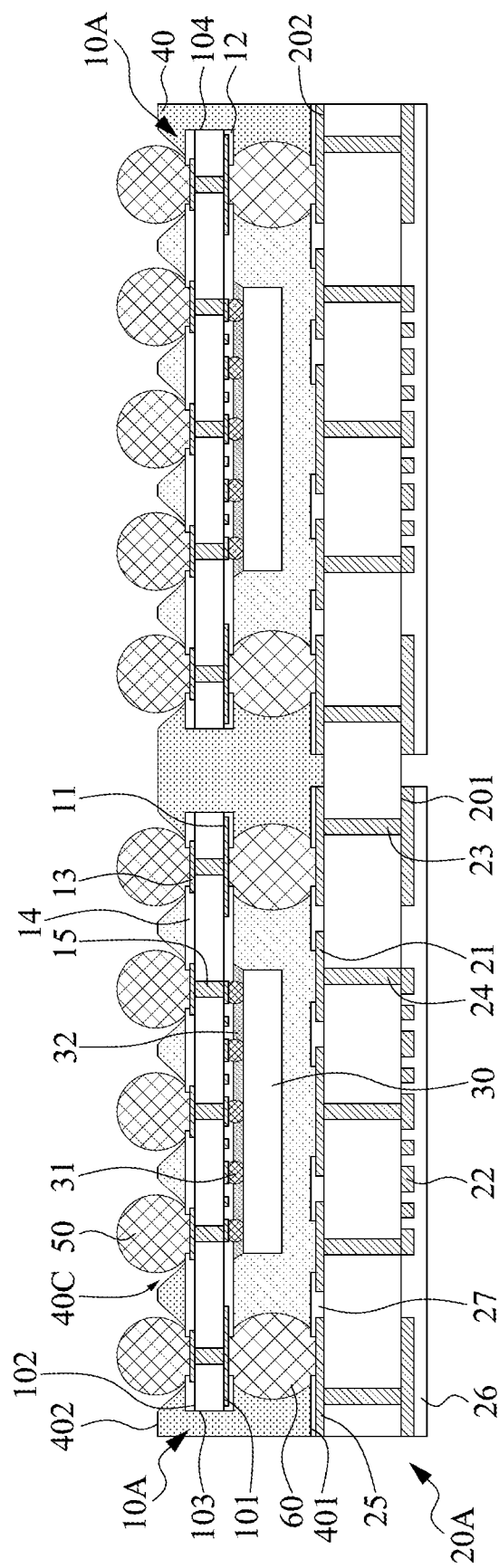

Referring to FIG. 6G, a plurality of electrical contacts 50 may be disposed on the exposed portions of the surfaces 102 of the carriers 10. In some embodiments, the electrical contacts 50 are disposed on the conductive pads 13 in the cavities 40C of the protective element 40. The electrical contacts 50 may include conductive bumps or solder balls. In some embodiments, an annealing operation is then performed on the electrical contacts 50.

Figure 6H:
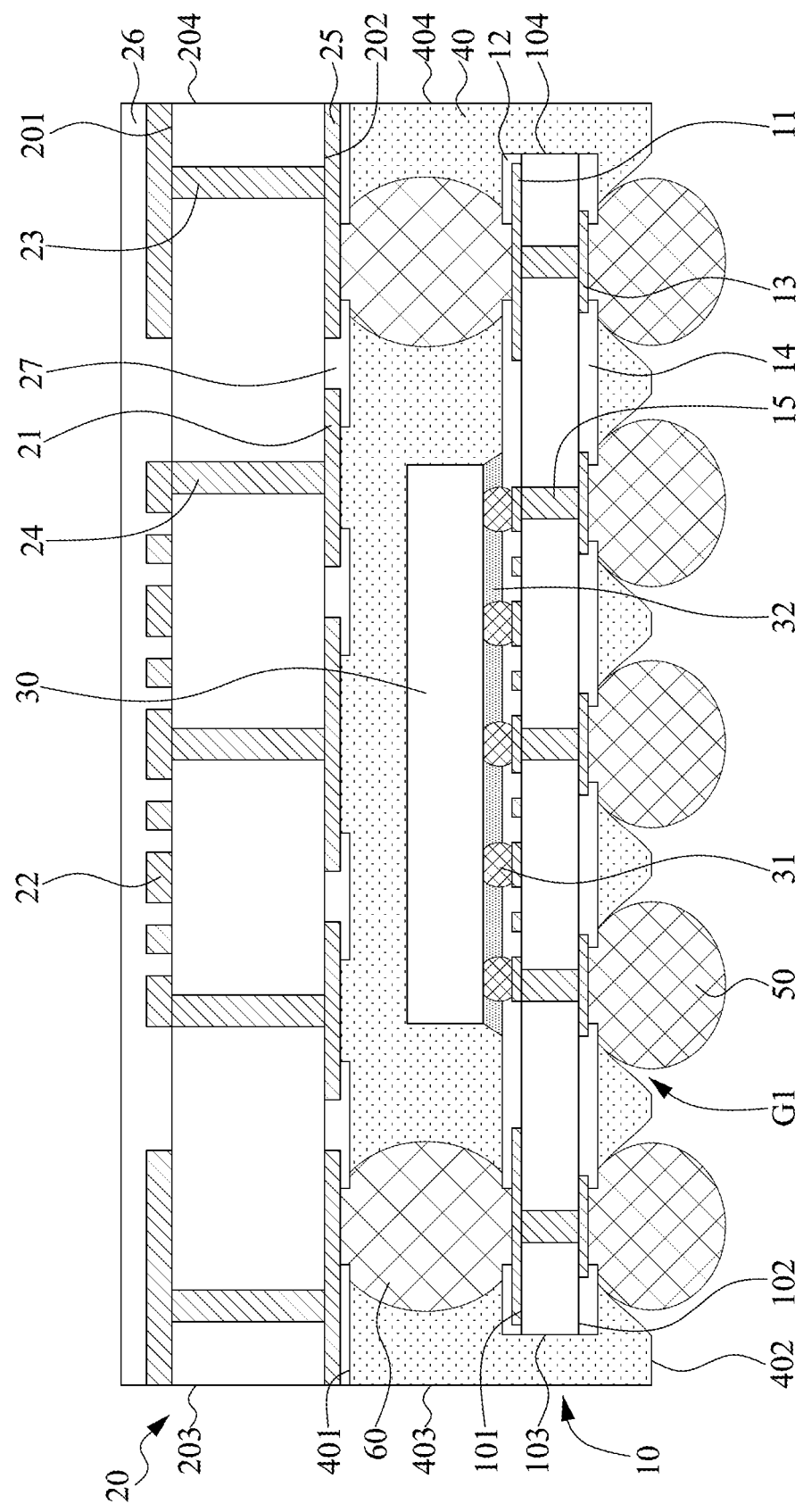

Referring to FIG. 6H, a singulation operation may be performed on the substrate strip 20A and the protective element 40. In some embodiments, the singulation operation is performed on portions of the protective element 40 between the device units 10A. In some embodiments, the singulation operation is performed after the electrical contacts 50 are disposed on the exposed portions of the surfaces 102 of the carriers 10. As such, the electronic package 2 as illustrated in FIG. 2 is formed.

In some cases where the protective element 40 (or the encapsulant) is disposed between the carrier 10 and the antenna substrate 20 by film molding, the entire structure of the carrier 10 and the antenna substrate 20 is disposed between an upper mold and a lower mold, and the protective material 40A (or the encapsulant material) is injected into the space therebetween. When the antenna substrate 20 has a relatively large thickness (e.g., about 800 μm to about 1000 μm) and thereby relatively poor thickness uniformity, the protective material 40A (or the encapsulant material) may be injected into a gap between the antenna substrate 20 and the upper mold, and thus the antenna patterns 22 may be covered by or contacting the protective element 40 (or the encapsulant).

In contrast, according to some embodiments of the present disclosure, the substrate strip 20A can serve as a lower mold for the over-molding operation in the manufacturing process, and thus the antenna patterns 22 can be free from contacting or being covered by the protective material 40A (or the encapsulant material). Therefore, the signal transmission performance of the antenna substrate 20 can be protected from adverse effects of contamination of the encapsulant material, and thus the performance of the electronic package can be improved.

In addition, according to some embodiments of the present disclosure, the over-molding operation can provide a portion of the protective element 40 further formed on a portion of the surface 102 of the carrier 10. Compared to a material or element differing from the protective element 40 being disposed on the surface 102 of the carrier 10, the protective element 40 includes a portion on the surface 102 of the carrier 10 and another portion between the carrier 10 and the antenna substrate 20, and thus the CTE mismatch between different materials or elements among the entire structure can be mitigated or prevented. Therefore, the stability and the reliability of the electronic package 2 can be improved.

FIG. 7A, FIG. 7B, FIG. 7C, and FIG. 7D illustrate various stages of a method of manufacturing an electronic package 5 in accordance with some embodiments of the present disclosure.

Figure 7A:
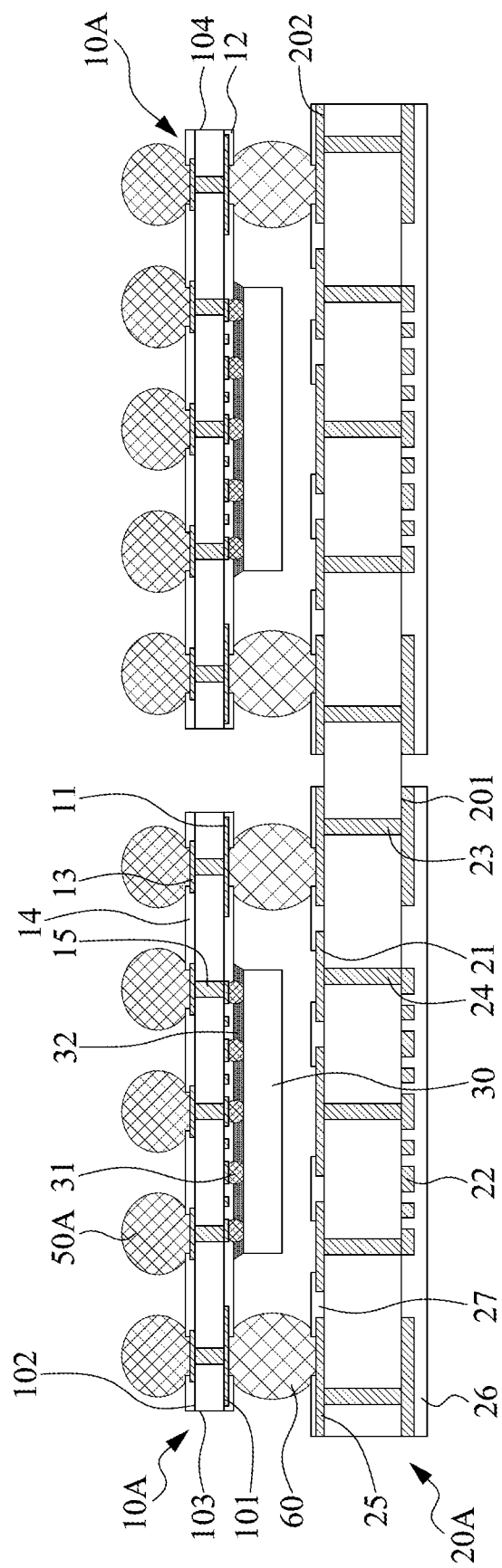
FIG. 7A, FIG. 7B, FIG. 7C, and FIG. 7D illustrate various stages of a method of manufacturing an electronic package in accordance with some embodiments of the present disclosure.

Referring to FIG. 7A, operations similar to those illustrated in FIGS. 6A-6C are performed, and a plurality of electrical contacts 50A may be disposed on the device units 10A.

Figure 7B:
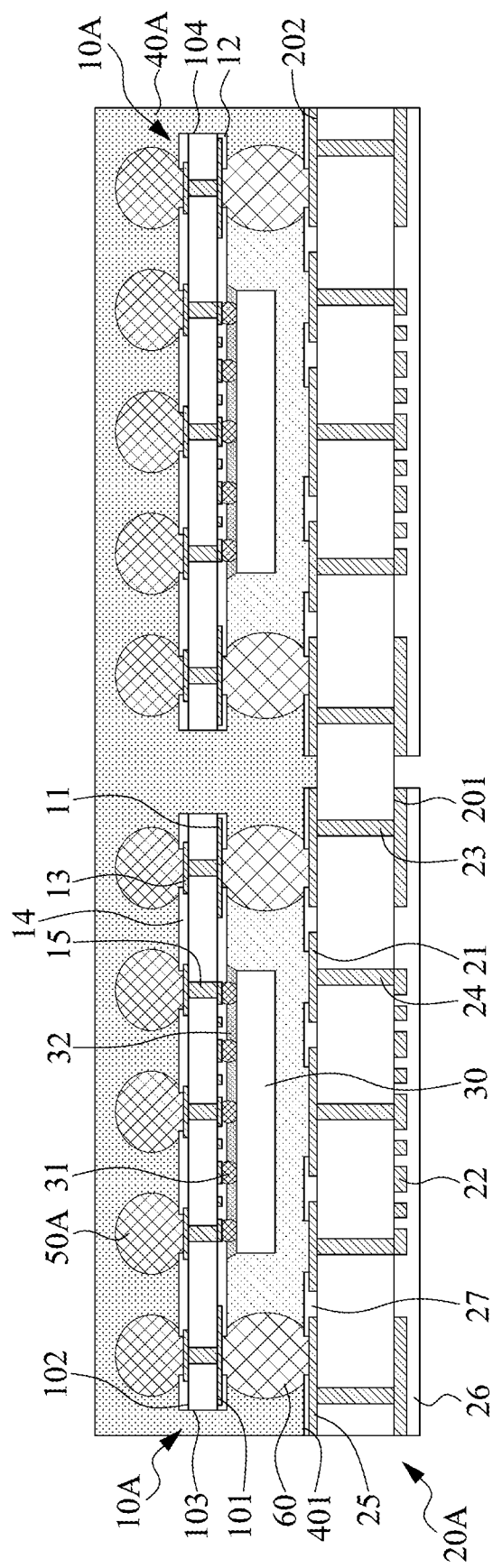

Referring to FIG. 7B, a protective material 40A may be disposed on the substrate strip 20A and between the device units 10A. In some embodiments, the protective material 40A is further disposed adjacent to the electrical contacts 50A. In some embodiments, the protective material 40A is further disposed on and covering the electrical contacts 50A.

Figure 7C:
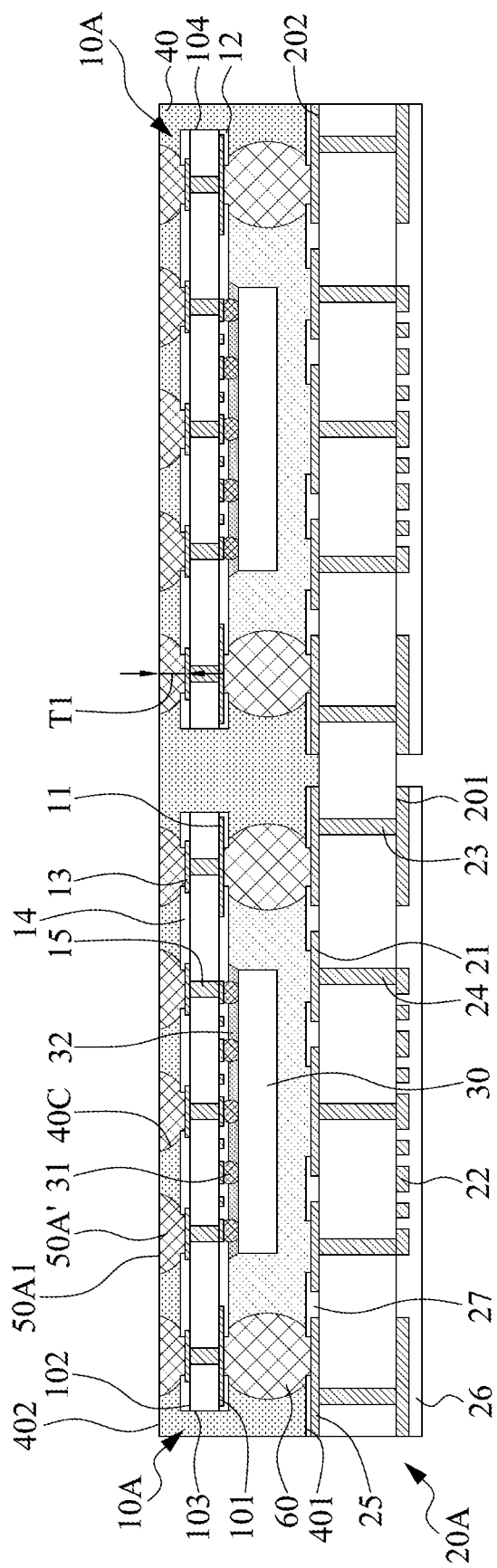

Referring to FIG. 7C, the protective material 40A may be thinned to expose electrical contacts 50A'. In some embodiments, grinding may be performed on the protective material 40A and the electrical contacts 50A to remove portions of the protective material 40A and portions of the electrical contacts 50A. In some embodiments, grinding may be performed on the protective material 40A and the electrical contacts 50A to form a protective element 40 and electrical contacts 50A' within cavities 40C of the protective element 40. In some embodiments, the electrical contacts 50A' are exposed by the protective element 40. In some embodiments, 50% or more of the volume of electrical contacts 50A is removed. In some embodiments, a thickness T1 of the remaining electrical contacts 50A' equals or is less than about 50% the thickness of the electrical contacts 50A. In some embodiments, a top surface (e.g., the surface 402) of the protective element 40 and top surfaces 50A1 of the electrical contacts 50A' are substantially coplanar.

Figure 7D:
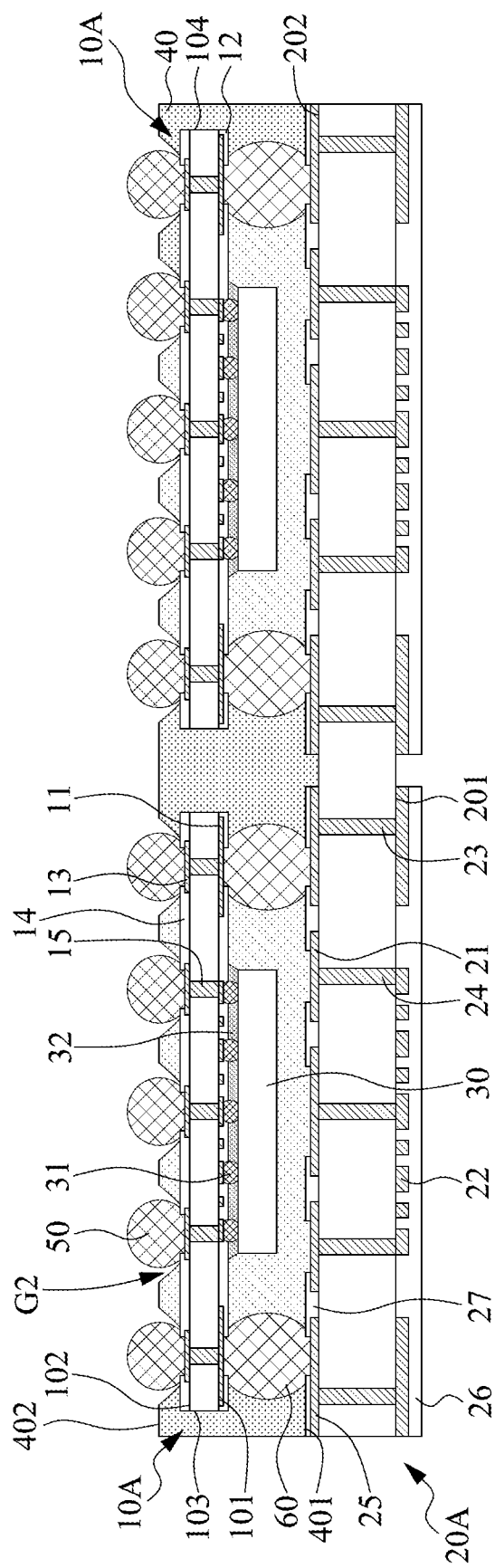

Referring to FIG. 7D, an annealing operation may be performed on the electrical contacts 50A' to form electrical contacts 50 in the cavities 40C of the protective element 40.

In some embodiments, embodiments, the electrical contacts 50 reform into balls after the annealing operation. In some embodiments, the electrical contacts 50 are spaced apart from the protective element 40. In some embodiments, the electrical contacts 50 protrude out of the surface 402 of the protective element 40.

Referring to FIG. 5, a singulation operation may be performed on the substrate strip 20A and the protective element 40. In some embodiments, the singulation operation is performed on portions of the protective element 40 between the device units 10A. As such, the electronic package 5 illustrated in FIG. 5 is formed.

FIG. 8A, FIG. 8B, FIG. 8C, and FIG. 8D illustrate various stages of a method of manufacturing an electronic package 8 in accordance with some embodiments of the present disclosure.

Figure 8A:
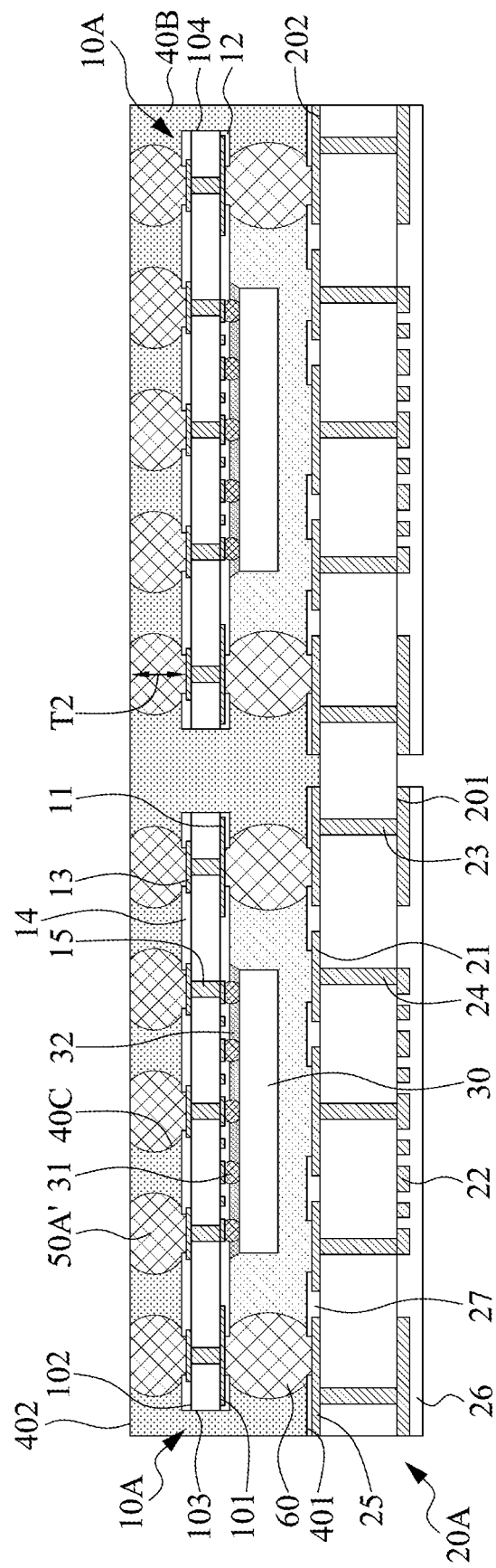
FIG. 8A, FIG. 8B, FIG. 8C, and FIG. 8D illustrate various stages of a method of manufacturing an electronic package in accordance with some embodiments of the present disclosure.

Referring to FIG. 8A, operations similar to those illustrated in FIGS. 7A-7B are performed, and the protective material 40A may be thinned to expose electrical contacts 50A'. In some embodiments, grinding may be performed on the protective material 40A and the electrical contacts 50A to remove portions of the protective material 40A and portions of the electrical contacts 50A. In some embodiments, grinding may be performed on the protective material 40A and the electrical contacts 50A to form a protective material 40B and electrical contacts 50A' within cavities 40C of the protective material 40B. In some embodiments, the electrical contacts 50A' are exposed by the protective material 40B. In some embodiments, 50% or less or 30% or less of the volume of the electrical contacts 50A is removed. In some embodiments, a thickness T2 of the remaining electrical contacts 50A' exceeds about 50% of the thickness of the electrical contacts 50A. In some embodiments, a thickness T2 of the remaining electrical contacts 50A' exceeds about 70% of the thickness of the electrical contacts 50A. In some embodiments, a top surface (e.g., (e.g., the surface 402) of the protective material 40B and top surfaces 50A1 of the electrical contacts 50A' are substantially coplanar.

Figure 8B:
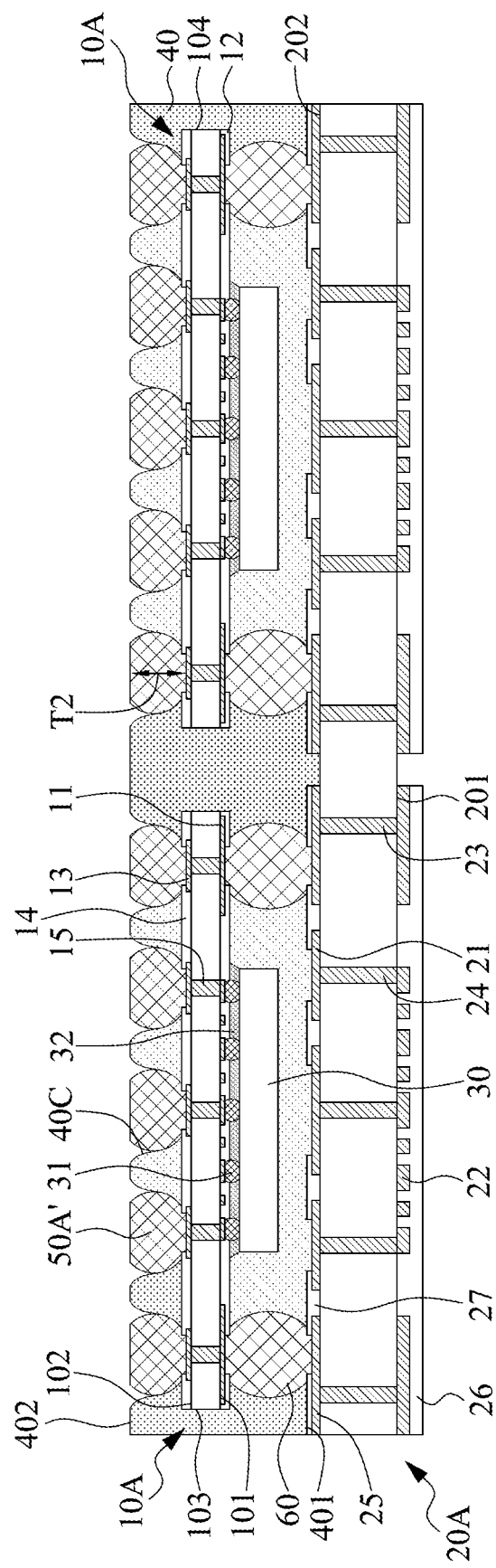

Referring to FIG. 8B, portions of the protective material 40B may be removed to expose portions of lateral surfaces of the electrical contacts 50A'. The portions of the protective material 40B may be removed by laser ablation to form a protective element 40 having enlarged cavities 40C. The cavities 40C of the protective element 40 may be expanded to further expose the electrical contacts 50A'.

Figure 8C:
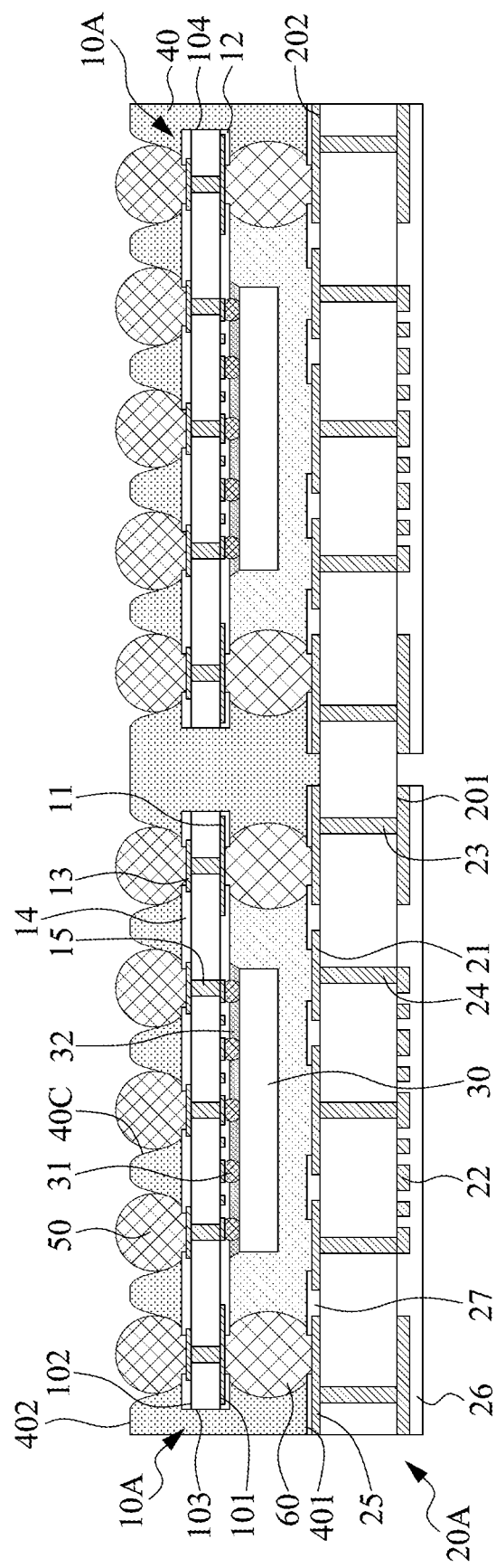

Referring to FIG. 8C, an annealing operation may be performed on the electrical contacts 50A' to form electrical contacts 50 in the cavities 40C of the protective element 40. In some embodiments, the electrical contacts 50 are reformed into balls after the annealing operation. In some embodiments, the electrical contacts 50 protrude out of the surface 402 of the protective element 40.

Figure 8D:
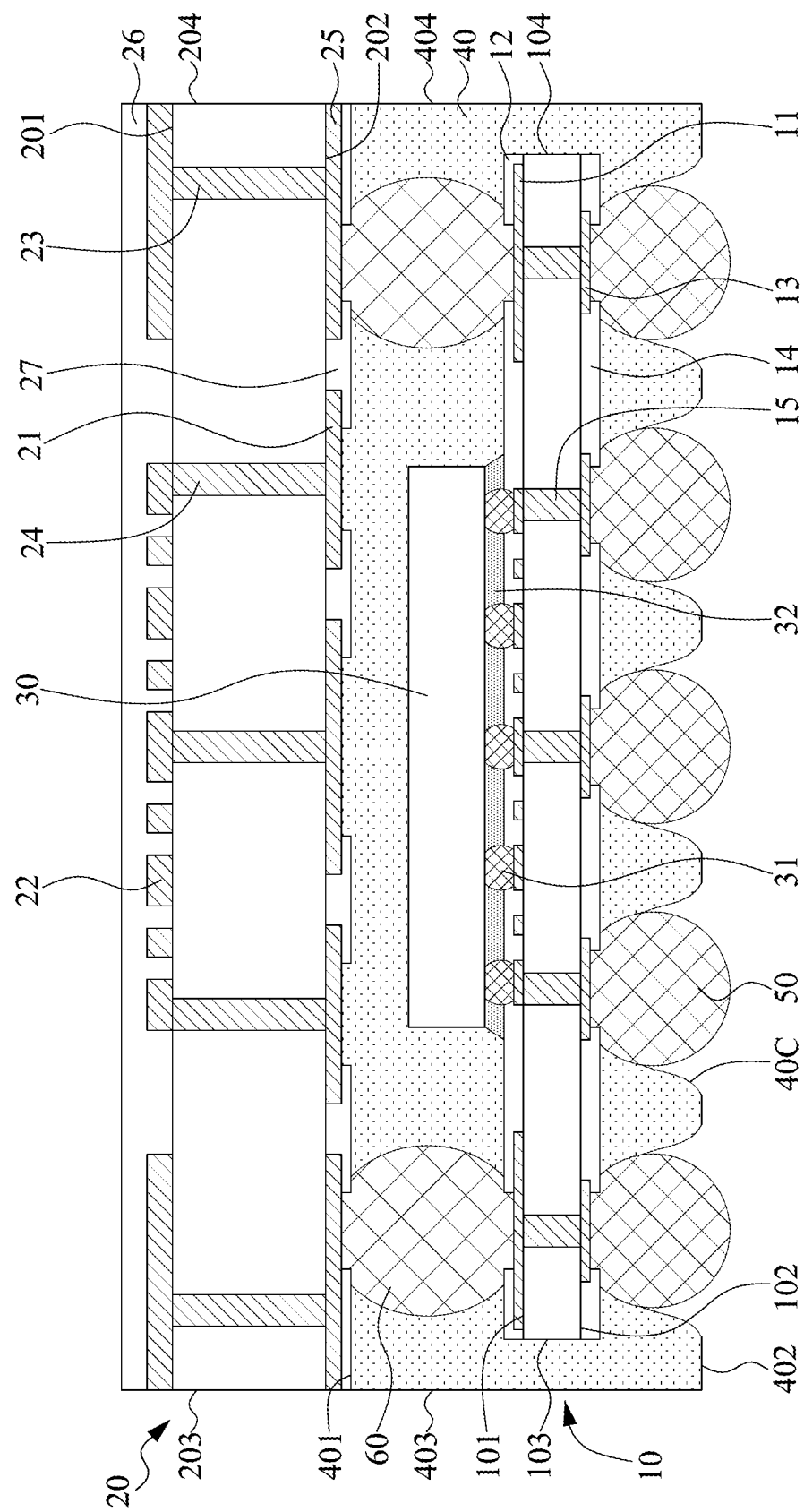

Referring to FIG. 8D, a singulation operation may be performed on the substrate strip 20A and the protective element 40. In some embodiments, the singulation operation is performed on portions of the protective element 40 between the device units 10A. As such, an electronic package 8 as illustrated in FIG. 8D is formed. In some embodiments, the electronic package 8 is similar to the electronic package 2 illustrated in FIG. 2, the differences therebetween lying in the contact area between the electrical contact 50 and the protective element 40 of the electronic package 8 exceeding the contact area between the electrical contact 50 and the protective element 40 of the electronic package 2.

FIG. 9A, FIG. 9B, FIG. 9C, and FIG. 9D illustrate various stages of a method of manufacturing an electronic package 9 in accordance with some embodiments of the present disclosure.

Figure 9A:
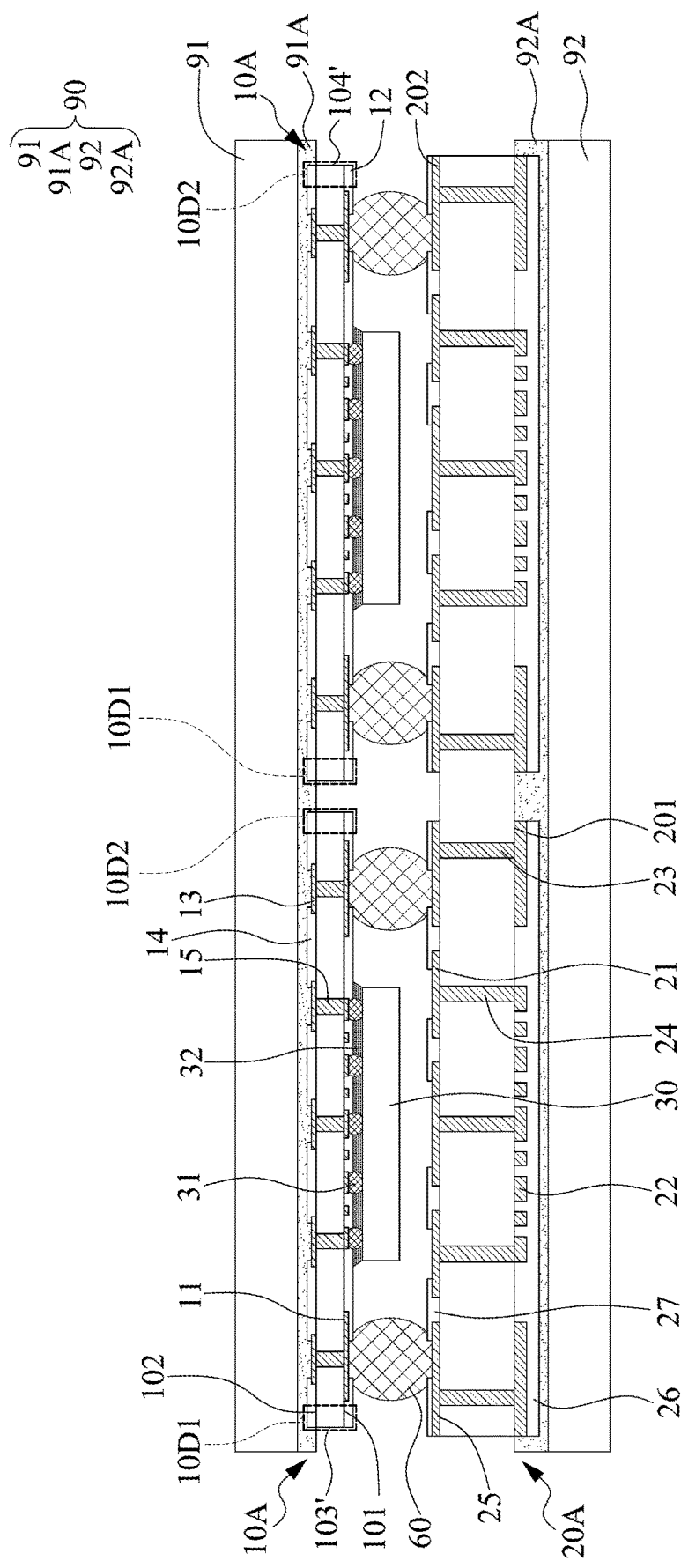
FIG. 9A, FIG. 9B, FIG. 9C, and FIG. 9D illustrate various stages of a method of manufacturing an electronic package in accordance with some embodiments of the present disclosure.

Referring to FIG. 9A, operations similar to those illustrated in FIGS. 6A-6C are performed, wherein each of the device units 10A may further include dummy regions 10D1 and 10D2, and the entire structure may be disposed in a molding apparatus 90. In some embodiments, the entire structure is disposed between an upper mold 91 and a lower mold 92. In some embodiments, the device units 10A contact a release film 91A on the upper mold 91. Portions of the release film 91A may be recessed by portions of the device units 10A. In some embodiments, the substrate strip 20A contacts a release film 92A on the lower mold 92. A portion of the release film 92A may be recessed by a portion of the substrate strip 20A.

Still referring to FIG. 9A, a protective material may be disposed on the substrate strip 20A and between the device units 10A to form a protective element 40. In some embodiments, the protective material is disposed between the upper mold 91 and the lower mold 92. In some embodiments, the protective material covers the dummy regions 10D1 adjacent to the surfaces 103' and the dummy regions 10D2 adjacent to the surfaces 104' of the carriers 10. In some embodiments, the protective material does not cover the surfaces 102 of the carriers 10.

Figure 9B:
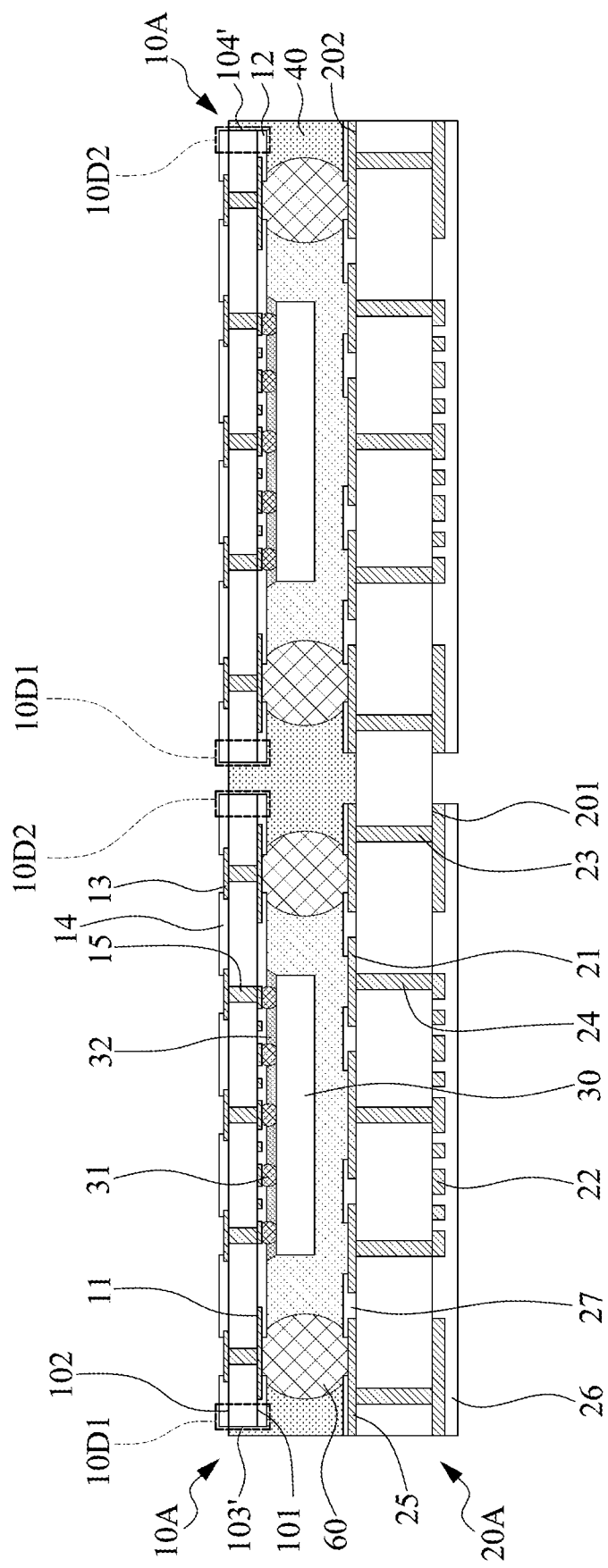

Referring to FIG. 9B, the molding apparatus 90 may be removed after the protective element 40 is disposed.

Figure 9C:
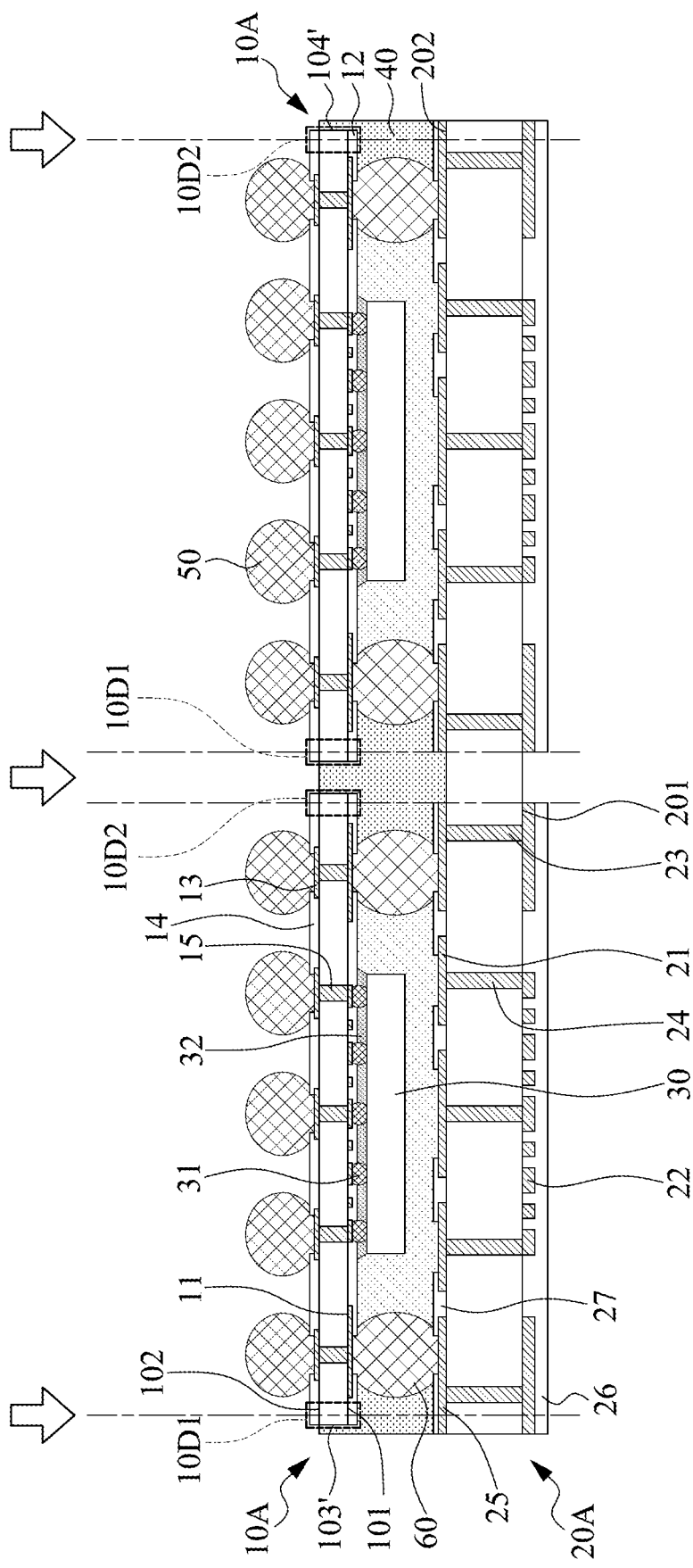

Referring to FIG. 9C, a plurality of electrical contacts 50 may be disposed on the surfaces 102 of the carrier 10, and a singulation operation may be performed on the substrate strip 20A and the protective element 40. In some embodiments, the singulation operation is further performed on the dummy regions 10D1 and 10D2 of the device units 10A. In some embodiments, portions of the dummy regions 10D1 and 10D2 of the device units 10A are removed by the singulation operation.

Figure 9D:
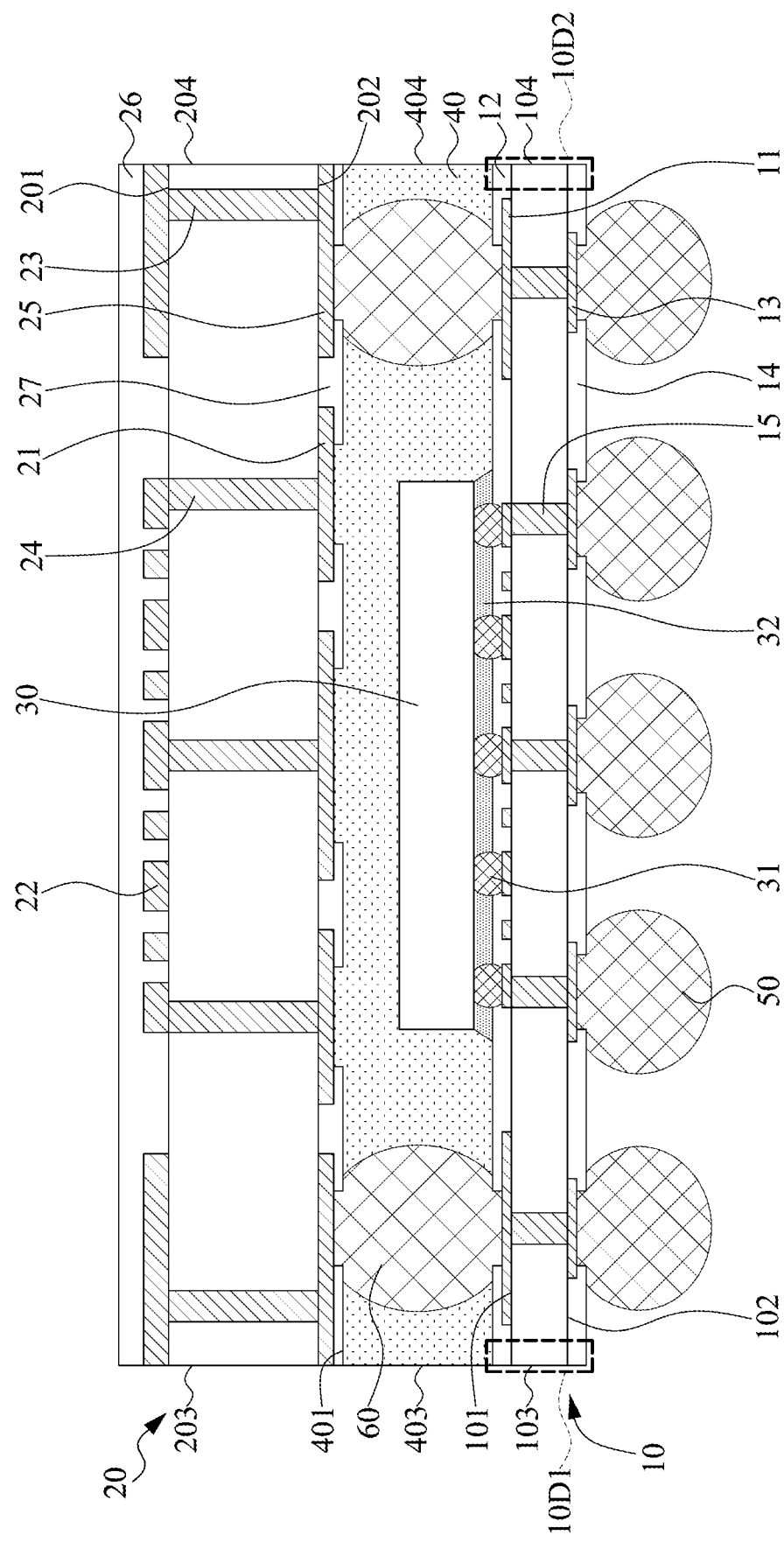

Referring to FIG. 9D, after the singulation operation, an electronic package 9 is formed. In some embodiments, each of the carriers 10 includes a dummy region 10D1 adjacent to the surface 103 and a dummy region 10D2 adjacent to the surface 104. In some embodiments, the electronic package 9 is similar to the electronic package 4 illustrated in FIG. 4, the difference therebetween lying in the surface 102 of the carrier 10 of the electronic package 9 not being covered by the protective element 40.

In some other embodiments, the electronic package 9 may be formed as follows. Referring to FIG. 9A, a carrier strip including a plurality of carriers 10 may be provided, a plurality of antenna substrates 20 may be bonded to the carrier strip, and the entire structure including the carrier strip and the antenna substrates 20 may be disposed in the molding apparatus 90. The carrier strip may include dummy regions or not include dummy regions depending on the actual application. Next, a protective material may be disposed between the upper mold 91 and the lower mold 92 to form a protective element 40. The protective element 40 may be disposed between the antenna substrates 20. The protective element 40 may be free from covering the antenna patterns 22 of the antenna substrates 20. The protective element 40 may be free from covering the surfaces 102 of the carriers 10 of the carrier strip. Next, referring to FIG. 9B, the molding apparatus 90 may be removed, electrical contacts 50 may be disposed on the surfaces 102 of the carriers 10 of the carrier strip, and singulation may be performed on the carrier strip and the protective element 40. As such, the electronic package 9 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
a carrier having a first surface and a second surface;
an antenna substrate comprising a resonant cavity and disposed over the first surface, the antenna substrate being closer to the first surface than the second surface of the carrier;
an electronic component disposed between the antenna substrate and the second surface of the carrier, wherein the electronic component is disposed between the carrier and the antenna substrate; and
an encapsulant encapsulating the electronic component, wherein a portion of the carrier is embedded within the encapsulant.

2. The electronic package of claim 1, wherein the antenna substrate comprises a ground element and an antenna pattern over the ground element, and the resonant cavity is defined by the ground element and the antenna pattern.

3. The electronic package of claim 2, wherein the antenna substrate further comprises a feeding element electrically connecting the carrier to the antenna substrate and physically separated apart from the ground element.

4. The electronic package of claim 1, wherein the encapsulant covers a lateral surface of the carrier.

5. The electronic package of claim 4, wherein a portion of the lateral surface of the carrier is exposed by the encapsulant.

6. An electronic package, comprising:
a carrier having a first surface and a second surface;
an antenna substrate comprising a resonant cavity and disposed over the first surface, the antenna substrate being closer to the first surface than the second surface of the carrier;
an electronic component disposed between the antenna substrate and the second surface of the carrier, wherein the electronic component is disposed between the carrier and the antenna substrate; and
an encapsulant encapsulating the electronic component, wherein the encapsulant covers a lateral surface of the carrier,
wherein the lateral surface is extending between the first surface and the second surface of the carrier, and the encapsulant further covers the second surface of the carrier.

7. An electronic package, comprising:
a carrier having a first surface and a second surface;
an antenna substrate comprising a resonant cavity and disposed over the first surface, the antenna substrate being closer to the first surface than the second surface of the carrier;
an electronic component disposed between the antenna substrate and the second surface of the carrier, wherein the electronic component is disposed between the carrier and the antenna substrate;
an encapsulant encapsulating the electronic component; and
a plurality of electrical contacts on the second surface of the carrier and encapsulated by the encapsulant.

* * * * *